(12) United States Patent
Park et al.

(10) Patent No.: US 8,513,070 B2
(45) Date of Patent: Aug. 20, 2013

(54) METHODS OF MANUFACTURING WIRE, TFT, AND FLAT PANEL DISPLAY DEVICE

(75) Inventors: Dong-Wook Park, Yongin (KR); Jong-Hyun Park, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 138 days.

(21) Appl. No.: 13/200,379

(22) Filed: Sep. 23, 2011

(65) Prior Publication Data

US 2012/0315717 A1 Dec. 13, 2012

(30) Foreign Application Priority Data

Jun. 13, 2011 (KR) .................. 10-2011-0057004

(51) Int. Cl.
*H01L 21/84* (2006.01)
*H01L 21/00* (2006.01)
*H01L 21/461* (2006.01)
*H01L 21/311* (2006.01)

(52) U.S. Cl.
USPC ............ 438/158; 438/159; 438/689; 438/700

(58) Field of Classification Search
USPC ................... 438/158, 159, 689, 700
See application file for complete search history.

(56) References Cited

U.S. PATENT DOCUMENTS

| | | | | |
|---|---|---|---|---|
| 6,757,032 | B1 * | 6/2004 | Zhang et al. | 349/44 |
| 7,413,940 | B2 * | 8/2008 | Lin | 438/158 |
| 2003/0203627 | A1 * | 10/2003 | Pang | 438/689 |
| 2004/0232495 | A1 * | 11/2004 | Saito et al. | 257/382 |
| 2005/0012151 | A1 * | 1/2005 | Yamaguchi et al. | 257/347 |
| 2005/0127818 | A1 * | 6/2005 | Ohtani | 313/500 |
| 2006/0086978 | A1 | 4/2006 | Kobayashi | |

FOREIGN PATENT DOCUMENTS

| | | |
|---|---|---|
| JP | 5-121405 | 5/1993 |
| KR | 1999-0050384 | 7/1999 |
| KR | 10-2004-0005385 | 1/2004 |
| KR | 10-2006-0052060 | 5/2006 |

* cited by examiner

*Primary Examiner* — Luan C Thai
(74) *Attorney, Agent, or Firm* — Robert E. Bushnell, Esq.

(57) ABSTRACT

A method of manufacturing a wire may include forming a wire pattern, which at least includes a first conductive layer, a second conductive layer, and a third conductive layer arranged in the order stated on a substrate. At least the second conductive layer may have higher etch selectivity than the first and third conductive layers. Side holes may be formed by removing portions of the second conductive layer at ends of the wire pattern, and fine wires may be formed by injecting a masking material into the side holes and patterning the wire pattern by using the masking material as a mask.

35 Claims, 21 Drawing Sheets

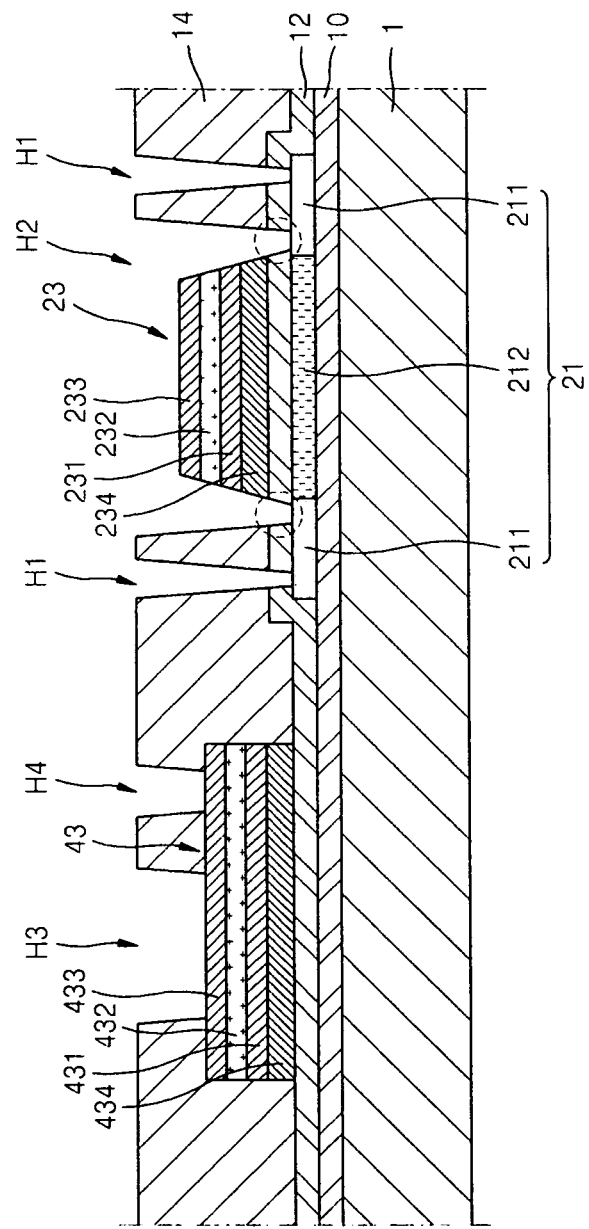

METHODS OF MANUFACTURING WIRE, TFT, AND FLAT PANEL DISPLAY DEVICE

CLAIM OF PRIORITY

This application makes reference to, incorporates the same herein, and claims all benefits accruing under 35 U.S.C. §119 from an application earlier filed in the Korean Intellectual Property Office on the 13 Jun. 2011 and there duly assigned Serial No. 10-2011-0057004.

BACKGROUND OF THE INVENTION

1. Field of the Invention

The present invention relates to methods of manufacturing a wire, a thin-film transistor (TFT), and a flat panel display device, and more particularly, to methods of manufacturing a fine wire or a fine gate electrode, and methods of manufacturing a TFT and a flat panel display device by applying the methods of manufacturing the fine wire or the fine gate electrode.

2. Description of the Related Art

A flat panel display device, such as an organic light emitting display device and a liquid crystal display device, is fabricated on a substrate on which a pattern including at least one thin-film transistor (TFT), a capacitor, and a wire connecting the TFT and the capacitor is formed. Due to recent miniaturization of flat panel display devices, demands for fine wire and fine TFT are increasing. Particularly, the size of a gate electrode included in a TFT is large in contradistinction to process capabilities, and thus there is a serious problem with respect to the size of a TFT in contradistinction to process capabilities. Therefore, the opening ratio of a pixel may not exceed a certain degree due to such as the TFT, and there is a limit in the reduction of dead space. Furthermore, a large TFT causes deteriorations of yield and performance with respect to fabrication of a system-on-panel (SOP).

However, it is difficult to pattern a metal line having a width from about 2 μm to about 4 μm by using conventional exposure equipment. Although it is possible to pattern a metal line having a fine width by using special equipment, the process is significantly slow and is not cost-competitive. Therefore, the method cannot be applied to mass-production.

SUMMARY OF THE INVENTION

The present invention provides methods of manufacturing a wire, a thin-film transistor (TFT), and a flat panel display device, and the methods for manufacturing a fine wire or a fine gate electrode According to an aspect of the present invention, there is provided a method of manufacturing a wire, and the method may include forming a wire pattern, which at least includes a first conductive layer, a second conductive layer, and a third conductive layer that are arranged in the order stated from a substrate, on the substrate, wherein at least the second conductive layer has higher etch selectivity than the first and third conductive layers; forming side holes by removing portions of the second conductive layer at ends of the wire pattern; and forming fine wires by injecting a masking material into the side holes and patterning the wire pattern by using the masking material as a mask.

The second conductive layer of the wire pattern may contain aluminum.

The first and third conductive layers of the wire pattern may contain one or more elements selected from a group consisting of silver (Ag), platinum (Pt), lead (Pd), gold (Au), nickel (Ni), neodymium (Nd), iridium (Ir), chrome (Cr), molybdenum (Mo), titanium (Ti), tungsten (W), copper (Cu), and alloys thereof.

The wire pattern may be arranged below the first conductive layer and further include a fourth conductive layer containing a metal oxide.

The step of patterning the wire pattern may be a step of removing the entire third conductive layer including the wire pattern, the entire second conductive layer in which the side holes are formed, and the first conductive layer except a portion corresponding to the masking material.

The fine wire patterns may include the first conductive layer.

The step of forming the side holes may be a step of selectively removing the second conductive layer by using an acidic etchant.

According to another aspect of the present invention, there is provided a method of manufacturing a thin-film transistor (TFT), and the method may include a first masking operation for forming an active layer on a substrate; forming a first insulation layer on the substrate to cover the active layer; a second masking operation for forming a gate electrode which at least includes a first conductive layer, a second conductive layer, and a third conductive layer that are arranged in the order stated from a substrate, on the first insulation layer, wherein at least the second conductive layer has higher etch selectivity than the first and third conductive layers; forming a second insulation layer on the first insulation layer to cover the gate electrode; a third masking operation for forming first openings exposing two opposite ends of the active layer by patterning the first insulation layer and the second insulation layer and forming a second opening exposing the entire gate electrode by patterning at least the second insulation layer; forming side holes by removing portions of the second conductive layer at ends of the exposed gate electrode; and a fourth masking operation for forming source/drain electrodes and fine gate electrodes by forming a metal layer at least on the second insulation layer, forming a masking layer to correspond at least to the first openings, injecting a masking material into the side holes, and patterning the metal layer and the gate electrode by using the masking layer and the masking material as masks.

The second conductive layer of the gate electrode may contain aluminum.

The first and third conductive layers of the gate electrode may contain one or more selected from a group consisting of silver (Ag), platinum (Pt), lead (Pd), gold (Au), nickel (Ni), neodymium (Nd), iridium (Ir), chrome (Cr), molybdenum (Mo), titanium (Ti), tungsten (W), copper (Cu), and alloys thereof.

The gate electrode may be arranged below the first conductive layer and further include a fourth conductive layer containing a metal oxide.

The third masking operation may include a third-first masking operation for patterning the second insulation layer corresponding to the first openings and the second opening; and a third-second masking operation for patterning the first insulation layer corresponding to the first openings.

In the third masking operation, the first insulation layer and the second insulation layer corresponding to the first openings and the second insulation layer corresponding to the second opening may be patterned by using a half-tone mask.

In the third masking operation, the first insulation layer and the second insulation layer corresponding to the first openings and the second opening may be simultaneously patterned.

In the fourth masking operation, the gate electrode may be patterned at the same time that the metal layer is patterned, and the fine gate electrodes may be formed by removing the entire third conductive layer including the gate electrode, the entire second conductive layer in which the side holes are formed, and the first conductive layer except a portion corresponding to the masking material.

The fine wire patterns may include the first conductive layer.

The method may further include forming at least one third insulation layer of an organic material, an inorganic material, or a combination thereof to cover the source/drain electrodes after the fourth masking operation.

The active layer may contain amorphous silicon or crystalline silicon.

After the second masking operation, the active layer except a portion corresponding to the gate electrode may be doped with an impurity.

After the fourth masking operation, the active layer except a portion corresponding to the fine gate electrodes may be doped with an impurity.

The step of forming the side holes may be a step of selectively removing the second conductive layer by using an acidic etchant.

The second opening may be formed in the third masking operation such that a gap is formed between the outer surface of the gate electrode and the inner surface of the second opening.

The metal layer may be formed so as not to completely fill the gap between the outer surface of the gate electrode and the inner surface of the second opening.

According to another aspect of the present invention, there is provided a method of manufacturing a flat panel display device. The method may include a first masking operation for forming an active layer on a substrate; forming a first insulation layer on the substrate to cover the active layer; a second masking operation for forming a gate electrode, which at least includes a first conductive layer, a second conductive layer, and a third conductive layer that are arranged in the order stated from a substrate, on the first insulation layer, wherein at least the second conductive layer has higher etch selectivity than the first and third conductive layers; forming a second insulation layer on the first insulation layer to cover the gate electrode; a third masking operation for forming first openings exposing two opposite ends of the active layer by patterning the first insulation layer and the second insulation layer and forming a second opening exposing the entire gate electrode by patterning at least the second insulation layer; forming side holes by removing portions of the second conductive layer at ends of the exposed gate electrode; a fourth masking operation for forming source/drain electrodes and fine gate electrodes by forming a metal layer at least on the second insulation layer, forming a masking layer to correspond at least to the first openings, injecting a masking material into the side holes, and patterning the metal layer and the gate electrode by using the masking layer and the masking material as masks; forming a third insulation layer to cover the source/drain electrodes and the fine gate electrodes; and forming an organic light emitting device electrically connected to any one of the source/drain electrodes.

The second conductive layer of the gate electrode may contain aluminum.

The first and third conductive layers of the gate electrode may contain one or more selected from a group consisting of silver (Ag), platinum (Pt), lead (Pd), gold (Au), nickel (Ni), neodymium (Nd), iridium (Ir), chrome (Cr), molybdenum (Mo), titanium (Ti), tungsten (W), copper (Cu), and alloys thereof.

The step of forming the organic light emitting device may include a fifth masking operation for forming a third opening which penetrates through the third insulation layer and exposes any one of the source/drain electrodes; a sixth masking operation for forming a pixel electrode, which is electrically connected to any one of the source/drain electrodes via the third opening, on the third insulation layer; forming an intermediate layer including an emissive layer on the pixel electrode; and forming a counter electrode which faces the pixel electrode across the intermediate layer.

The method may further include a seventh masking operation for forming a fourth insulation layer on the third insulation layer to cover the ends of the pixel electrode.

The gate electrode may be arranged below the first conductive layer and further include a fourth conductive layer containing a metal oxide.

The second masking operation may further include forming a pixel electrode, which includes first through fourth electrode layers respectively corresponding to the first through fourth conductive layers, on the first insulation layer, the third masking operation may further include exposing at least a portion of the pixel electrode by removing the second insulation layer covering the pixel electrode, and the fourth masking operation may further include removing the first through third electrode layers of the exposed pixel electrode.

The step of forming the organic light emitting device may further include a fifth masking operation for exposing the fourth electrode layer of the pixel electrode by removing the third insulation layer covering the pixel electrode; forming the intermediate layer including the emissive layer on the fourth electrode layer of the pixel electrode; and forming the counter electrode which faces the pixel electrode across the intermediate layer.

The third masking operation may include a third-first masking operation for patterning the second insulation layer corresponding to the first openings and the second opening; and a third-second masking operation for patterning the first insulation layer corresponding to the first openings.

In the third masking operation, the first insulation layer and the second insulation layer corresponding to the first openings and the second insulation layer corresponding to the second opening may be patterned by using a half-tone mask.

In the third masking operation, the first insulation layer and the second insulation layer corresponding to the first openings and the second opening may be simultaneously patterned.

In the fourth masking operation, the gate electrode may be patterned at the same time that the metal layer is patterned, and the fine gate electrodes may be formed by removing the entire third conductive layer including the gate electrode, the entire second conductive layer in which the side holes are formed, and the first conductive layer except a portion corresponding to the masking material.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
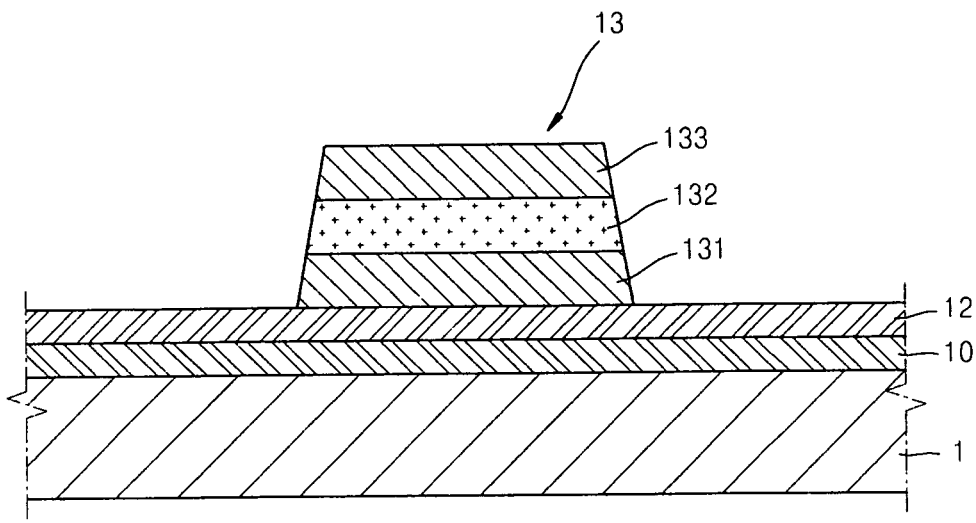
FIGS. 1 through 4 are schematic sectional views showing a method of manufacturing a wire according to an embodiment of the present invention.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

While such terms as "first," "second," etc. may be used to describe various components, such components must not be limited to the above terms. The above terms are used only to distinguish one component from another.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc. are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Hereinafter, the present invention will be described in detail by explaining preferred embodiments of the invention with reference to the attached drawings.

FIGS. 1 through 4 are schematic sectional views showing a method of manufacturing a wire according to an embodiment of the present invention.

Referring to FIG. 1, a wire pattern 13 is formed on a substrate 1.

The substrate 1 may be formed of a transparent glass material based on $SiO_2$. However, the substrate 1 is not limited thereto, and the substrate 1 may be formed of any of various materials, such as a transparent plastic material or a metal.

Meanwhile, an auxiliary layer 10, such as a barrier layer, a blocking layer, and/or a buffer layer for preventing impurity ions from spreading on the top surface of the substrate 1, blocking permeation of moisture or outer atmosphere, and planarizing the top surface of the substrate 1, may be arranged. The auxiliary layer 10 may be formed of $SiO_2$ and/or $SiN_x$ by using any of various methods, such as plasma enhanced chemical vapor deposition (PECVD) method, atmospheric pressure CVD (APCVD) method, low pressure CVD (LPCVD) method, etc. Various insulation layers may be formed on the auxiliary layer 10, e.g., a gate insulation layer or an interlayer insulation layer. In FIG. 1, a first insulation layer 12 which functions as a gate insulation layer is formed on the auxiliary layer 10.

The wire pattern 13 may be formed to have a single-layer structure or a multi-layer structure in a wire region, and width, length, and thickness of the wire pattern 13 may be freely determined by a user.

In detail, the wire pattern 13 may be formed by forming a single-layer metal layer or a multi-layer metal layer and patterning the metal layer in a masking operation using a first mask (not shown).

The wire pattern 13 includes at least a first conductive layer 131, a second conductive layer 132, and a third conductive layer 133 extending in the order stated from the substrate 1. The second conductive layer 132 features higher etch selectivity as compared to the first conductive layer 131 and the third conductive layer 133. In other words, the second conductive layer 132 is etched more than the first conductive layer 131 and the third conductive layer 133 under a same etching condition. For example, the second conductive layer 132 may contain aluminum (Al), whereas the first conductive layer 131 and the third conductive layer 133 may contain one or more selected from a group consisting of silver (Ag), platinum (Pt), lead (Pd), gold (Au), nickel (Ni), neodymium (Nd), iridium (Ir), chrome (Cr), molybdenum (Mo), titanium (Ti), tungsten (W), copper (Cu), and alloys thereof. However, embodiments of the present invention are not limited thereto, and the second conductive layer 132 may be formed of any metals having different etch selectivity with respect to the first and third conductive layers 131 and 133, respectively.

Figure 2:
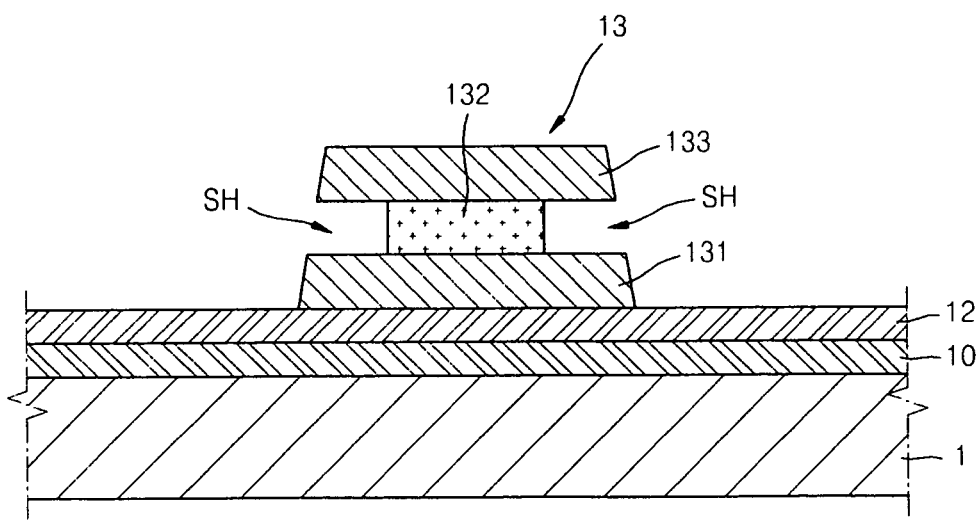

Referring to FIG. 2, portions of the second conductive layer 132 at ends of the wire pattern 13 are selectively removed to form side holes SH.

In detail, the side holes SH may be formed via chemical etching or physical etching. For example, the side holes SH may be formed by supplying an etchant consisting of fluoric acid (HF), hydrochloric acid (HCl), sulfuric acid ($H_2SO_4$), nitric acid ($HNO_3$), phosphoric acid, acetic acid, or a compound thereof to the wire pattern 13, and selectively removing the second conductive layer 132 having relatively high etch selectivity. The side holes SH may be formed in ends or outer portions of the wire patterns 13 that may likely to be contacted by an etchant, and depth of the side holes SH from the outer portion of the wire pattern 13 may be from about 1 μm to about 2 μm. Depth and width of the side holes SH may be controlled by changing the type of etchant and etching time.

Figure 3:
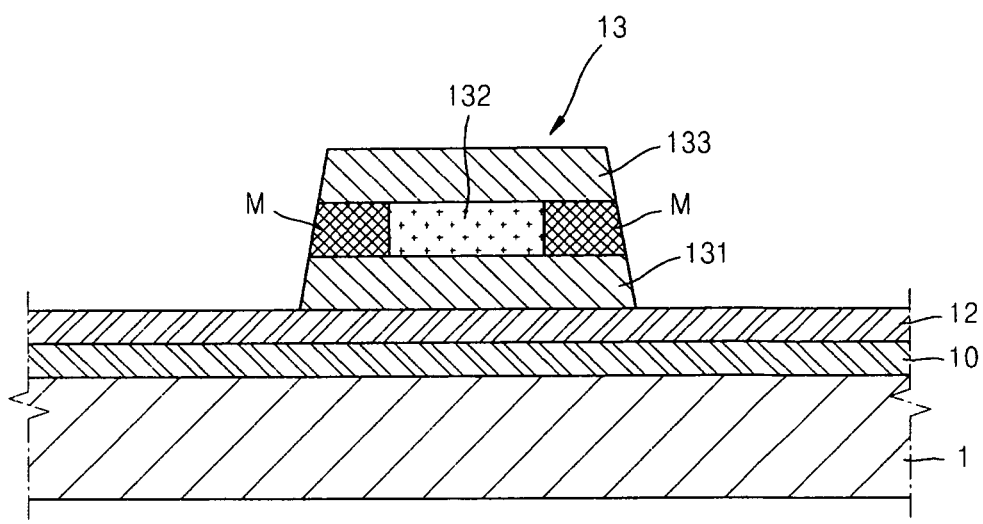
Figure 4:
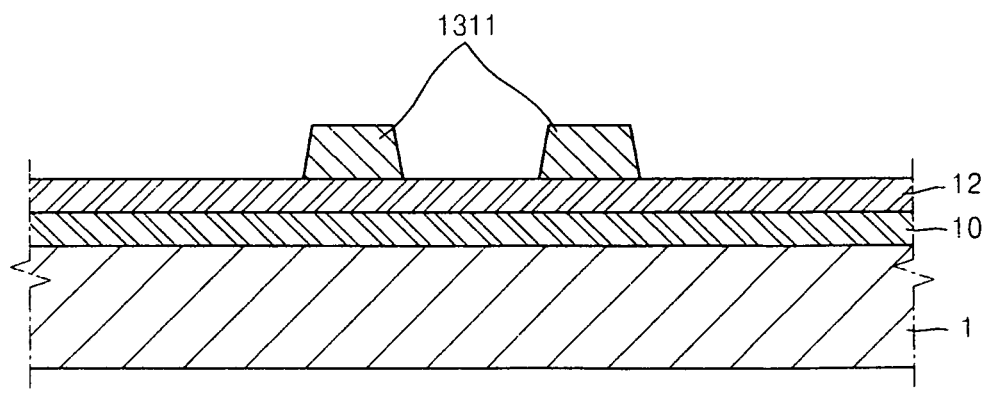

Referring to FIGS. 3 and 4, fine wires 1311 are formed by patterning the wire pattern 13 by using the side holes SH.

In detail, the fine wires 1311 may be formed by injecting a masking material M into the side holes SH and performing a masking operation using the injected masking material M as a mask.

First, referring to FIG. 3, the masking material M is injected into the side hole SH, and thus a mask for forming the fine wires 1311 is fabricated. The masking material M may be photoresist or the like. Even if photoresist is coated by using a commonly known method, the masking material M may be injected into the side holes SH due to surface tension of the side holes SH or capillary phenomenon.

Next, referring to FIG. 4, the wire pattern 13 except for a portion below the masking material M is removed by patterning the wire pattern 13 using the masking material M as a mask. In detail, the entire third conductive layer 133 including the wire pattern 13, the entire second conductive layer 132 in which the side holes SH are formed, and the first conductive layer 131 except a portion corresponding to the masking material M are removed. Therefore, the remaining portion of the first conductive layer 131 becomes fine wires 1311. The width of the fine wires 1311 may correspond to the depth of the side hole SH.

Figure 5:
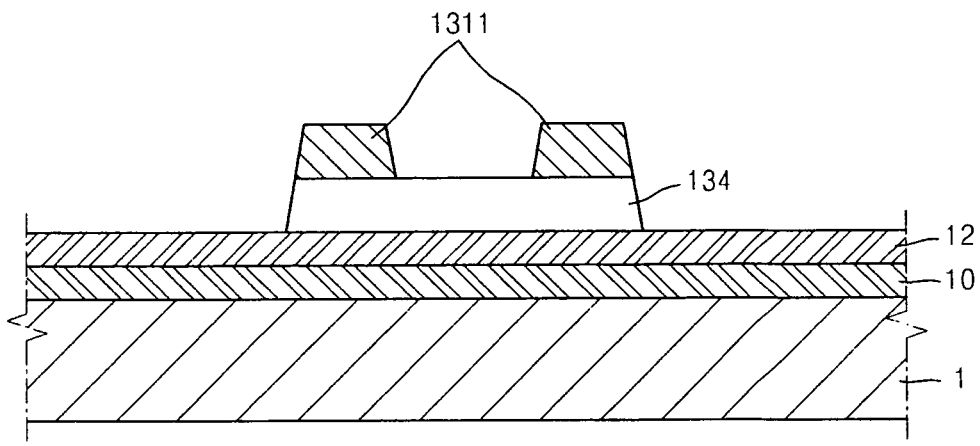
FIG. 5 is a schematic sectional view of a fine wire according to another embodiment of the present invention.

FIG. 5 is a schematic sectional view of a fine wire according to another embodiment of the present invention.

Referring to FIG. 5, a fourth conductive layer 134 containing a metal oxide may be further arranged below the first conductive layer 131 of the wire pattern 13, and thus the fourth conductive layer 134 may remain below the fine wires 1311. Although not shown, the fourth conductive layer 134 may be patterned according to the shape of the fine wires 1311.

According to the present embodiment, the fine wires 1311 have a width below or equal to from about 1 μm to about 2 μm by using conventional equipment. Therefore, the present embodiment provides cost-wise competence and may be applied to mass-production.

Hereinafter, a method of fabricating a fine gate electrode of a thin-film transistor (TFT) by applying the method of fabricating fine wires and a method of manufacturing a flat panel display device including a fine gate electrode fabricated by using the method will be described.

Figure 6:
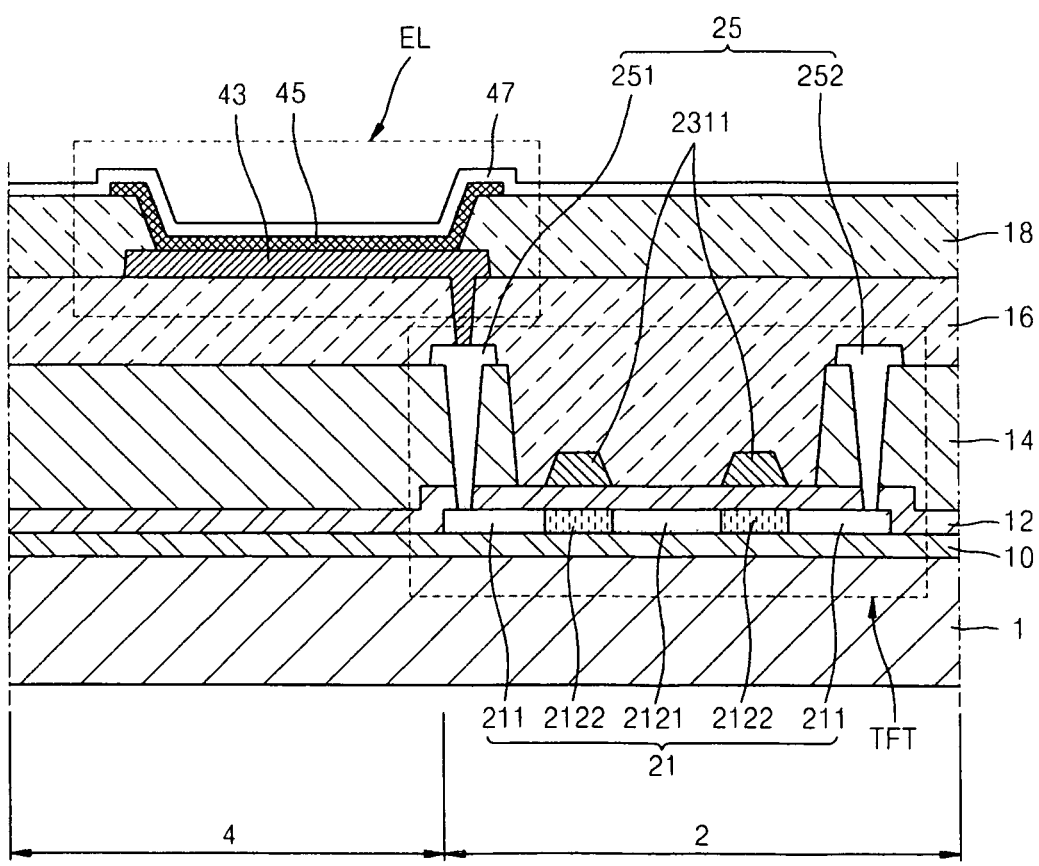
FIG. 6 is a schematic sectional view of a flat panel display device according to an embodiment of the present invention.

FIG. 6 is a schematic sectional view of a flat panel display device according to an embodiment of the present invention.

Referring to FIG. 6, the flat panel display device includes a transistor region 2 and a light emitting region 4. The flat panel display device may further include a storage region having at least one capacitor and a wire region having at least one wire. Meanwhile, the wire region may include fine wires shown in FIGS. 4 and 5.

A TFT is arranged in the transistor region 2 as a driving device. The TFT consists of an active layer 21, a gate electrode, and source/drain electrodes 25. The gate electrode includes at least one fine gate electrode 2311, whereas the fine gate electrode 2311 is formed of a conductive material having relatively low electric resistance. A first insulation layer 12 is interposed between the gate electrode and the active layer 21 as a gate insulation layer. Furthermore, source/drain regions 211 doped with impurities are respectively formed at two opposite ends of the active layer 21 and the center portion of the active layer 21 not corresponding to the fine gate electrode 2311. Particularly, the source/drain regions 211 formed at two opposite ends of the active layer 21 are connected to the source/drain electrodes 25, respectively. Meanwhile, channel regions 2122 are formed in portions of the active layer 21 corresponding to the fine gate electrode 2311.

A TFT according to the present embodiment may be embodied as a TFT in which the channel regions 2122 are connected in series by adjusting intervals between the fine gate electrodes 2311. Meanwhile, if intervals between the fine gate electrode 2311 is reduced, two channel regions 2122 connected in series are combined to form a single channel region 2122, and thus the TFT may be embodied as a single TFT. Meanwhile, according to an embodiment of the present invention, a TFT having a gate electrode with fine width may be fabricated. Therefore, dead space may be reduced due to reduction of an internal circuit of a flat panel display device, and opening rate may be increased due to reduction of volume of a TFT in a pixel. Furthermore, since a TFT may be scaled down, driving voltage may be reduced, and thus the TFT may be driven at a low voltage.

The light emitting region 4 includes an organic light emitting device EL. The organic light emitting device EL includes a pixel electrode 43, a counter electrode 47 that is formed to face the pixel electrode 43, and an intermediate layer 45 which is interposed therebetween and includes an organic emissive layer.

According to an embodiment of the present invention, the light emitting region 4 includes the organic light emitting device EL, and thus the structure shown in FIG. 6 may be used as a back plane for an organic light emitting display device. However, the present invention is not limited thereto. For example, if liquid crystals are arranged between the pixel electrode 43 and the counter electrode 47, the structure shown in FIG. 6 may be used as a back plane for a liquid crystal display device.

FIGS. 7 through 18 are schematic sectional views showing operations for manufacturing the flat panel display device shown in FIG. 6. Hereinafter, operations for manufacturing the flat panel display device shown in FIG. 6 will be briefly described.

Figure 7:
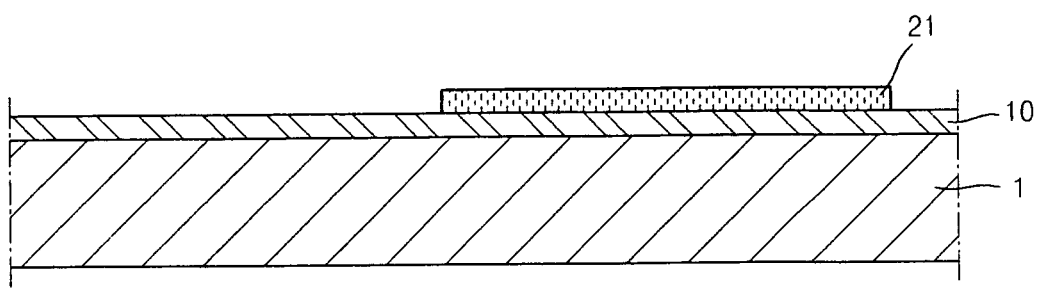
FIGS. 7 through 18 are schematic sectional views showing operations for manufacturing the flat panel display device shown in FIG. 6.

First, as shown in FIG. 7, the active layer 21 of the TFT is formed on the substrate 1 on which the auxiliary layer 10 is formed.

The active layer 21 is patterned in a masking operation using a first mask (not shown).

In detail, a polycrystalline silicon layer (not shown) is formed by depositing amorphous silicon on the auxiliary layer 10 and crystallizing the amorphous silicon. The amorphous silicon may be crystallized by using any of various methods, such as rapid thermal annealing (RTA), solid phase crystallization (SPC), excimer laser annealing (ELA), metal induced crystallization (MIC), metal induced lateral crystallization (MILC), sequential lateral solidification (SLS), etc. The polycrystalline silicon layer formed as described above is patterned to the active layer 21 of the TFT in the masking operation using the first mask (not shown).

Figure 8:
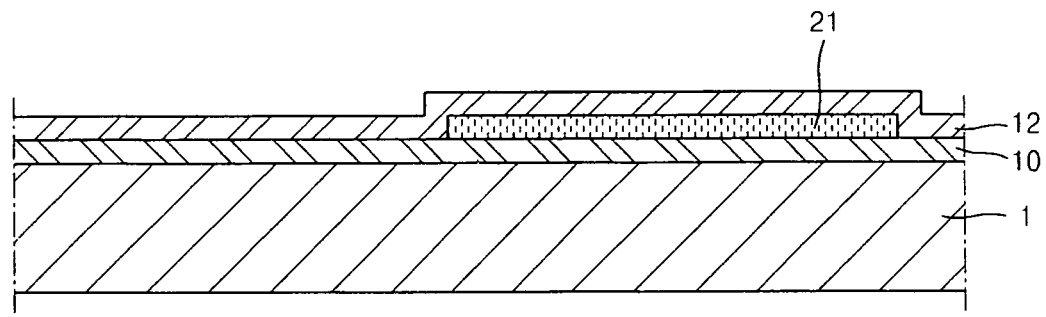

Next, as shown in FIG. 8, the first insulation layer 12 is formed on the auxiliary layer 10 to cover the active layer 21.

The first insulation layer 12 may be formed by depositing an inorganic insulation layer, such as a $SiN_x$ layer or a $SiO_x$ layer, by using a method, such as PECVD, APCVD, LPCVD, etc. The first insulation layer 12 is interposed between the active layer 21 of the TFT and the fine gate electrode (2311 of FIG. 6) and functions as a gate insulation layer of –3 the TFT.

Figure 9:
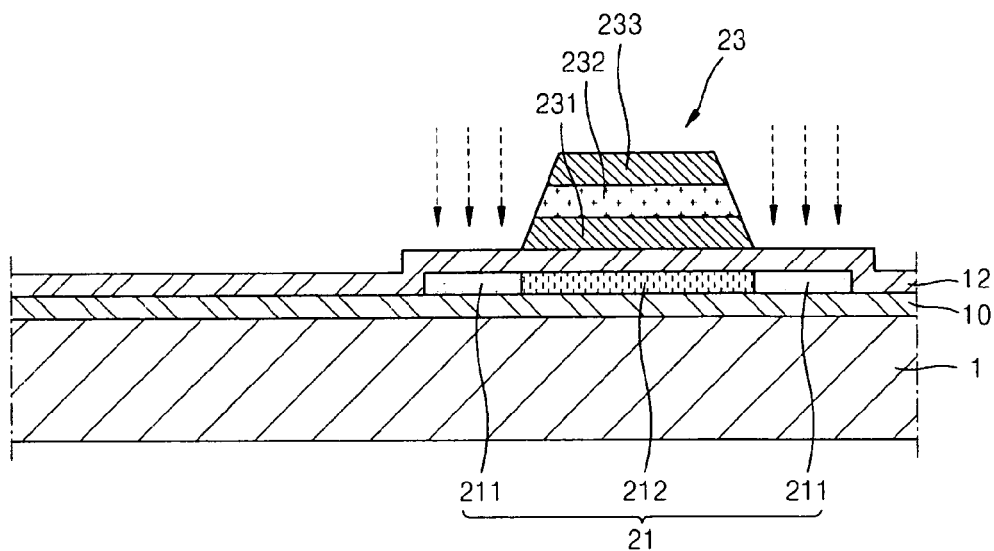

Next, as shown in FIG. 9, a gate electrode 23 is formed.

The gate electrode 23 is formed by patterning a first layer (not shown), a second layer (not shown), and a third layer (not shown) that are stacked on the substrate 1 in the order stated in a masking operation using a second mask (not shown).

In detail, the gate electrode 23 includes at least a first conductive layer 231 corresponding to the first layer, a second conductive layer 232 corresponding to the second layer, and a third conductive layer 233 corresponding to the third layer that are stacked on the substrate 1 in the order stated. Here, the second conductive layer 232 features higher etch selectivity as compared to the first conductive layer 231 and the third conductive layer 233. In other words, the second conductive layer 232 is etched more than the first conductive layer 231 and the third conductive layer 233 under a same etching condition. For example, the second conductive layer 232 may contain aluminum (Al), whereas the first conductive layer 231 and the third conductive layer 233 may contain one or more selected from a group consisting of silver (Ag), platinum (Pt), lead (Pd), gold (Au), nickel (Ni), neodymium (Nd), iridium (Ir), chrome (Cr), molybdenum (Mo), titanium (Ti), tungsten (W), copper (Cu), and alloys thereof.

In the latter regard, the gate electrode 23 is formed to correspond to the center of the active layer 21, and the source/drain regions 211 are formed at the two opposite ends of the active layer 21 by implanting an n-type impurity or a p-type impurity into the active layer 21 by using the gate electrode 23 as a self-align mask, and a channel layer 212 is formed between the source/drain regions 211. Here, the impurity may be boron (B) ions or phosphor (P) ions.

Figure 10:
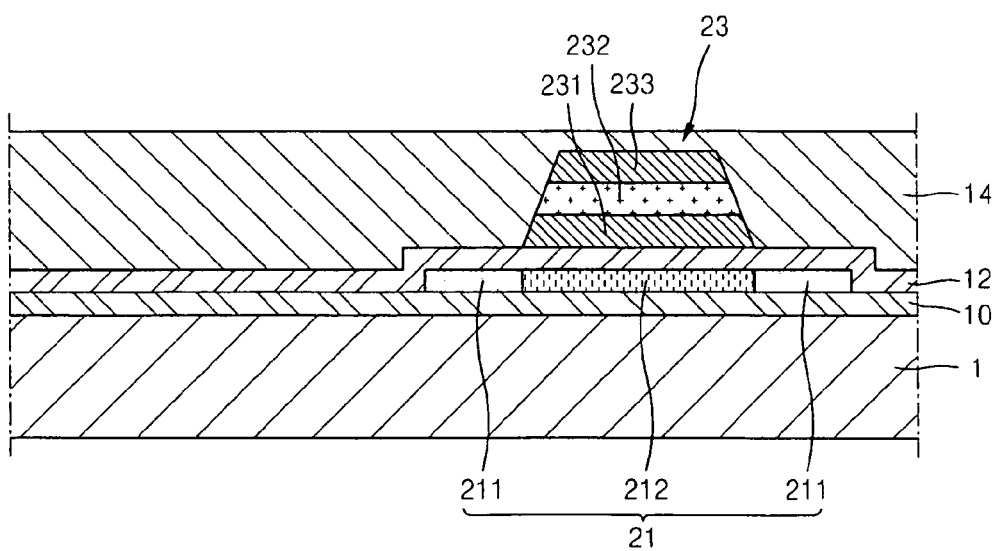

Next, as shown in FIG. 10, a second insulation layer 14 is formed on the first insulation layer 12 to cover the gate electrode 23.

The second insulation layer 14 is formed of one or more organic insulation material selected from a group consisting of polyimide, polyamide, acrylic resins, benzocyclobuten, and phenol resions by using a method, such as spin coating. The second insulation layer 14 functions as an interlayer insulation layer between the gate electrode 23 of the TFT and the source/drain electrodes (25 of FIG. 6). Meanwhile, the second insulation layer 14 may not only be formed of an organic insulation material as described above, but may also be formed of an inorganic insulation material like as the first insulation layer 12 described above. Alternatively, the second insulation layer 14 may be formed by alternately stacking an organic insulation material and an inorganic insulation material.

Figure 11A:
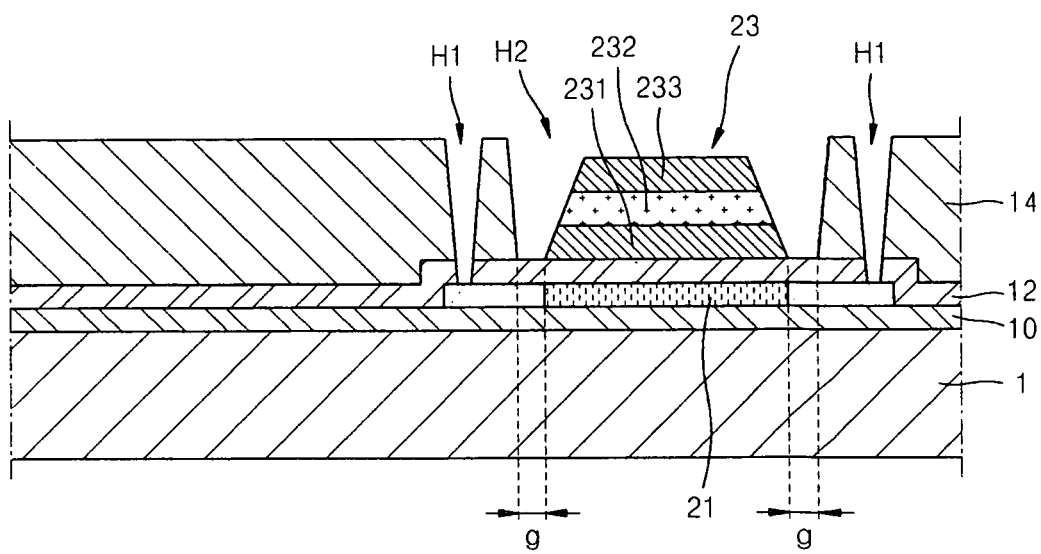

Next, as shown in FIG. 11A, an opening which completely exposes the gate electrode 23 is formed in the second insulation layer 14, and openings which partially expose the source/drain regions 211 of the active layer 21 are formed in the first insulation layer 12 and the second insulation layer 14.

The openings may be formed via patterning in a masking operation using at least one third mask (not shown).

In detail, first openings H1 are formed in the first insulation layer 12 and the second insulation layer 14 to partially expose the source/drain regions 211 and to function as contact holes. The second opening H2 is formed in the second insulation layer 14 to completely expose the gate electrode 23. Here, the second opening H2 is formed so that a gap is formed between the inner surface of the second opening H2 and the outer surface of the gate electrode 23. The gap provides bad step coverage when a metal layer for forming the source/drain electrodes 25 later is formed on the substrate 1, and thus space between gate electrode 23 and the second opening H2 is not completely filled with the metal layer for forming the source/drain electrodes 25. Therefore, this is a space into which the masking material M for fabricating the fine gate electrode 2311 may be injected.

In the structure shown in FIG. 11A, the first openings H1 are formed in both the first insulation layer 12 and the second insulation layer 14 and expose the active layer 21, whereas the second opening H2 is formed only in the second insulation layer 14 and does not expose the active layer 21.

In the structure shown in FIG. 11A, openings may be patterned via at least two masking operations for patterning the first insulation layer 12 and the second insulation layer 14 separately. In detail, the first openings H1 and the second opening H2 are formed in the second insulation layer 14 by using a third-first mask (not shown), and then the first openings H1 are formed in the first insulation layer 12 by using a third-second mask (not shown). However, the present invention is not limited thereto. For example, in the structure shown in FIG. 11A, the first insulation layer 12 and the second insulation layer 14 may be separately patterned by using a half-tone mask (not shown). Therefore, in the structure shown in FIG. 11A, the active layer 21 is not exposed by the second opening H2, and thus the active layer 21 may be prevented from being damaged in later operations. Furthermore, in the structure shown in FIG. 11A, the active layer 21 is not over-etched during formation of the second opening H2, and thus increase in electric resistance and deterioration of device reliability due to reduction of thickness of the active layer 21 may be prevented.

Figure 11B:
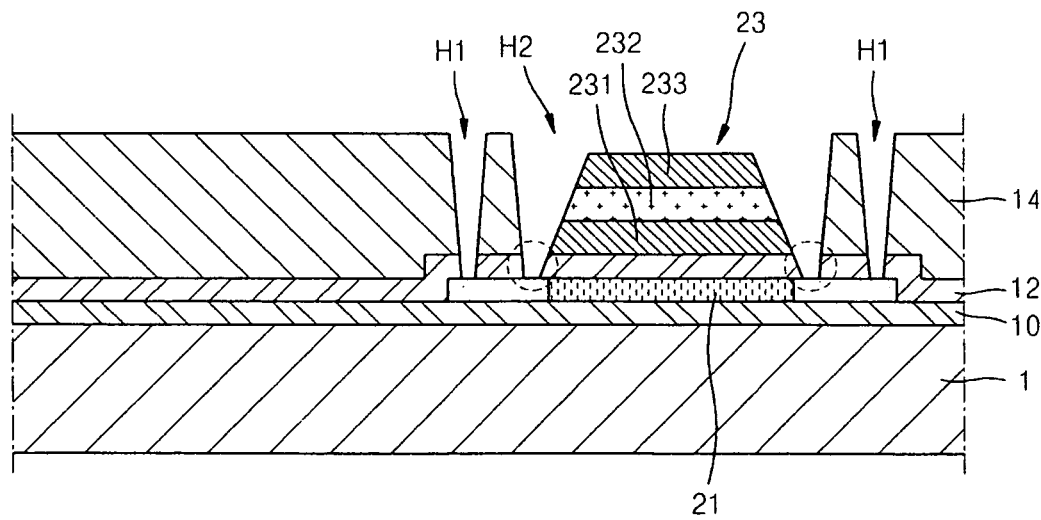

Meanwhile, FIG. 11B shows a structure according to another embodiment of the present invention, in which, unlike in the structure shown in FIG. 11A, both the first openings H1 and the second opening H2 are formed in both the first insulation layer 12 and the second insulation layer 14 and expose the active layer 21.

In detail, in the structure shown in FIG. 11B, the first openings H1 and the second opening H2 may be formed in a single masking operation using a third mask (not shown) for simultaneously patterning the first insulation layer 12 and second insulation layer 14. Therefore, the structure shown in FIG. 11B features improved production efficiency and cost-wise competence due to reduced masking operations.

Figure 12:
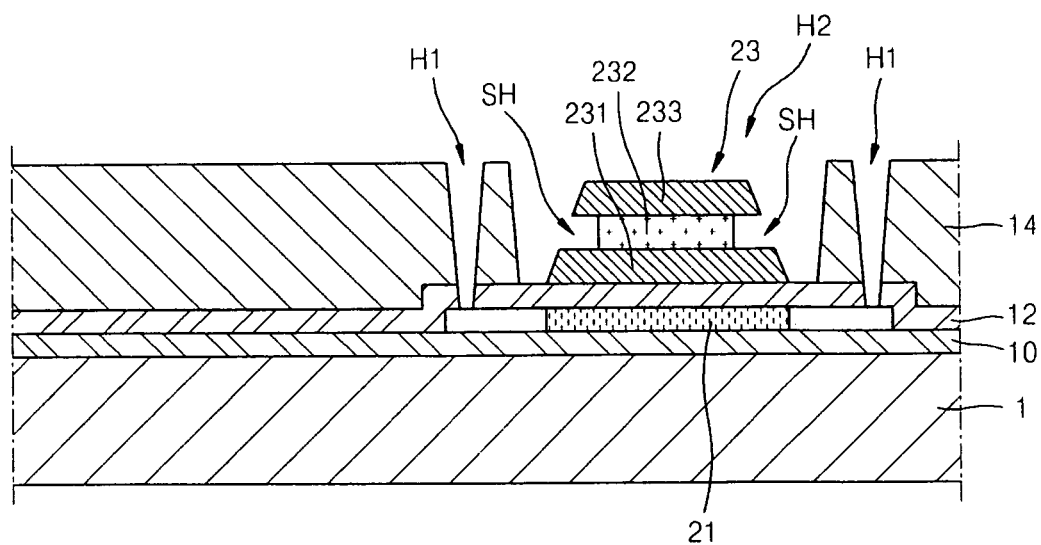

Next, as shown in FIG. 12, the side holes SH are formed by selectively removing portions of the second conductive layer 232 at respective ends of the gate electrode 23.

In detail, the side holes SH may be formed via chemical etching or physical etching. For example, the side holes SH may be formed by supplying an etchant consisting of fluoric acid (HF), hydrochloric acid (HCl), sulfuric acid ($H_2SO_4$), nitric acid, phosphoric acid, acetic acid, or a compound thereof to the gate electrode 23 and selectively removing the second conductive layer 132 having relatively high etch selectivity. Here, the side holes SH may be formed in ends or outer portions of the gate electrode 23 that may likely be contacted by an etchant. Depth of the side holes SH from the outer portion of the gate electrode 23 may be from about 1 μm to about 2 μm. Depth and width of the side holes SH may be controlled by changing the type of etchant and etching time. Meanwhile, the operation for forming the side hole SH shown in FIG. 12 may be added as a separate operation or may be replaced with a cleaning operation using fluoric acid that is performed prior to the operation shown in FIG. 13.

Figure 13:
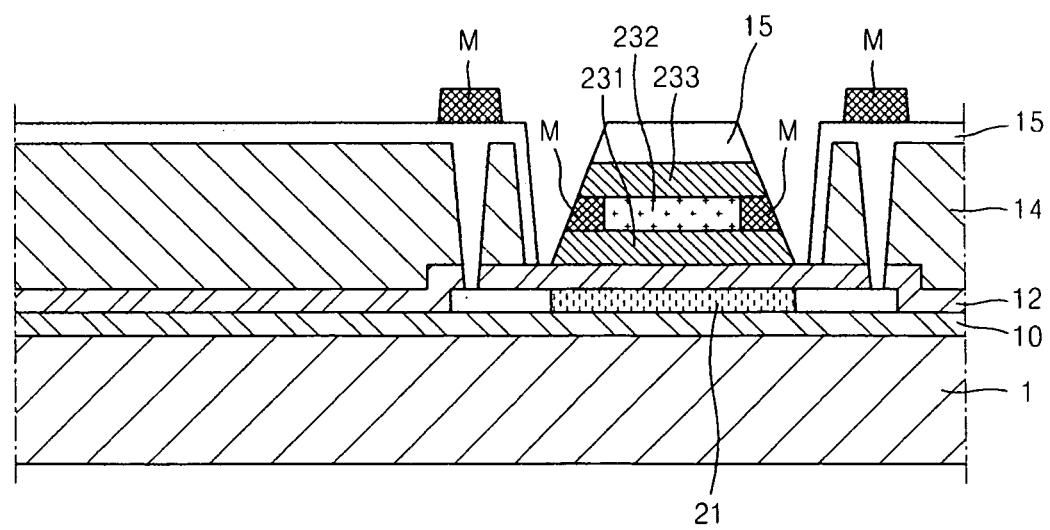

Next, as shown in FIG. 13, a metal layer 15 for forming the source/drain electrodes 25 is formed on the substrate 1 to cover the gate electrode 23 and the second insulation layer 14, and the masking material M is applied thereto.

The metal layer 15 may be formed of a conductive material having relatively low electric resistance the same as materials constituting the first conductive layer 231 and the third conductive layer 233. However, the present invention is not limited thereto, and the metal layer 15 may be formed of any of various conductive materials. Meanwhile, the metal layer 15 is formed to have a sufficient thickness to fill the first openings H1, but the metal layer 15 is formed not to fill the second opening H2. Here, the second opening H2 is formed to completely expose the gate electrode 23, and particularly, a gap is formed between the outer surface of the gate electrode 23 and the inner surface of the second opening H2. The gap provides bad step coverage to prevent the second opening H2 from being completely filled with the metal layer 15.

The masking material M is uniformly and thoroughly applied onto the metal layer 15. Particularly, the masking material M is injected into the side holes SH. The masking material M may be photoresist or the like. Even if photoresist is applied by using a commonly known method, the masking material M may be injected into the side holes SH due to surface tension of the side holes SH or capillary phenomenon.

After the masking material M is applied, a masking layer M having a pattern based on a portion not corresponding to openings of a fourth mask (not shown) is formed by exposing the photoresist material in a masking operation using the fourth mask by using an exposure equipment, such as a stepper, and developing the expoaws photoresist in a case where the photoresist is a positive photoresist. In a case where the photoresist is a negative photoresist, the masking layer M having a pattern based on the openings of the fourth mask (not shown) is formed by developing the exposed photoresist. Here, the fourth mask is a mask for forming at least the source/drain electrodes 25. Therefore, as shown in FIG. 13, the masking layer M remains at locations at which the source/drain electrodes 25 are to be formed.

Figure 14:
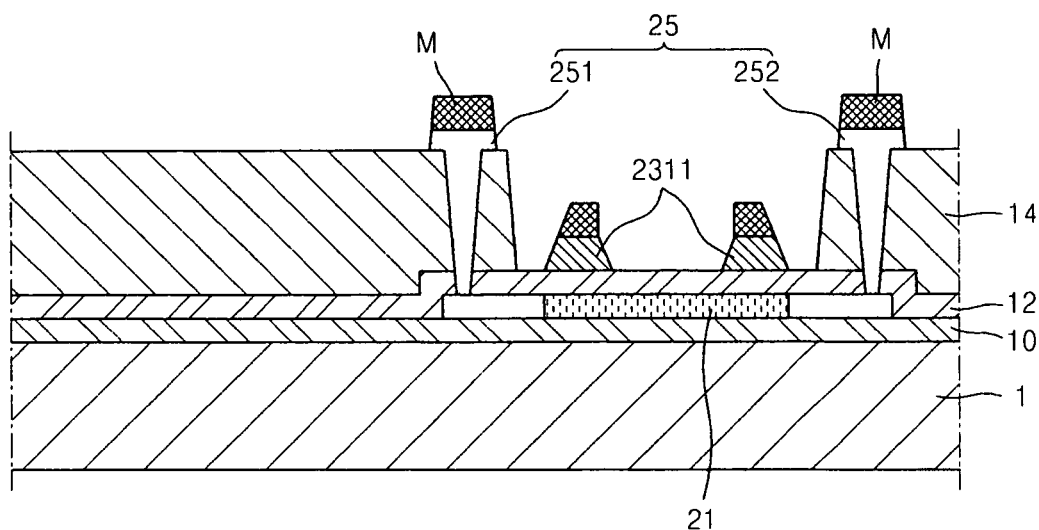

Next, as shown in FIG. 14, the source/drain electrodes 25 are formed by etching the metal layer (15 of FIG. 13) by using the remaining masking layer M as a mask, and the fine gate electrodes 2311 are formed by etching the gate electrode (23 of FIG. 13) by using the masking material M injected into the side holes SH as a mask.

In detail, the fine gate electrodes 2311 are formed by leaving a portion of the first conductive layer (231 of FIG. 13) located below the masking material M by patterning the gate electrode (23 of FIG. 13) by using the masking material M injected into the side holes SH as a mask. In other words, the entire third conductive layer (233 of FIG. 13) constituting the gate electrode (23 of FIG. 13), the entire second conductive layer (232 of FIG. 13) in which the side holes SH are formed, and the first conductive layer (231 of FIG. 13) except a portion corresponding to the masking material M are removed. Therefore, the remaining portion of the first conductive layer (231 of FIG. 13) becomes fine gate electrodes 2311. Here, width of the fine gate electrodes 2311 may correspond to depth of the side hole SH. Meanwhile, although not shown, the masking layer M and the masking material M remaining in FIG. 14 are removed in a peeling operation, such as an aching operation or a stripping operation.

Figure 15:
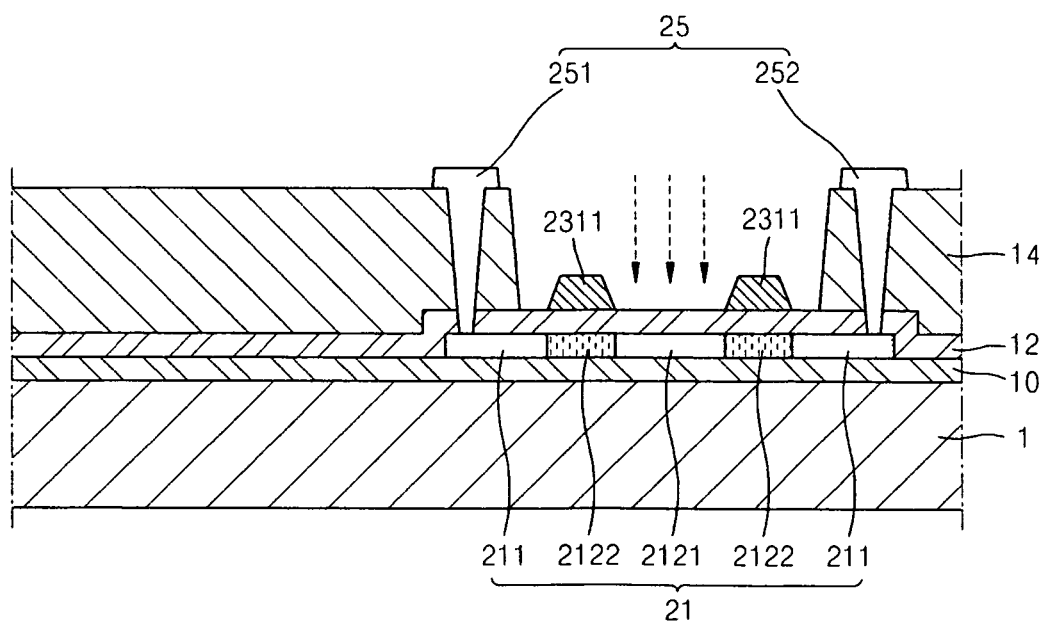

Next, as shown in FIG. 15, the active layer 21 is re-doped with an n-type impurity or a p-type impurity.

In detail, an n-type impurity or a p-type impurity may be implanted into the center of the active layer 21, which is to be covered by the gate electrode (23 of FIG. 13), via the second opening H2. Here, the source/drain regions 2121 may be formed at the center of the active layer 21 by using the fine gate electrode 2311 as a self-align mask, and the two channel regions 2122 connected in series may be formed. The impurity implanted to the active layer 21 may be the same as or different from the impurity implanted to the active layer 21 in FIG. 9. For example, the impurity may be boron (B) ions or phosphor (P) ions.

According to an embodiment of the present invention, a TFT in which the two channel regions 2122 are connected in series may be fabricated by fabricating the fine gate electrodes 2311 and re-doping the active layer 21 by using the fine gate electrodes 2311 as a self-align mask.

Figure 16:
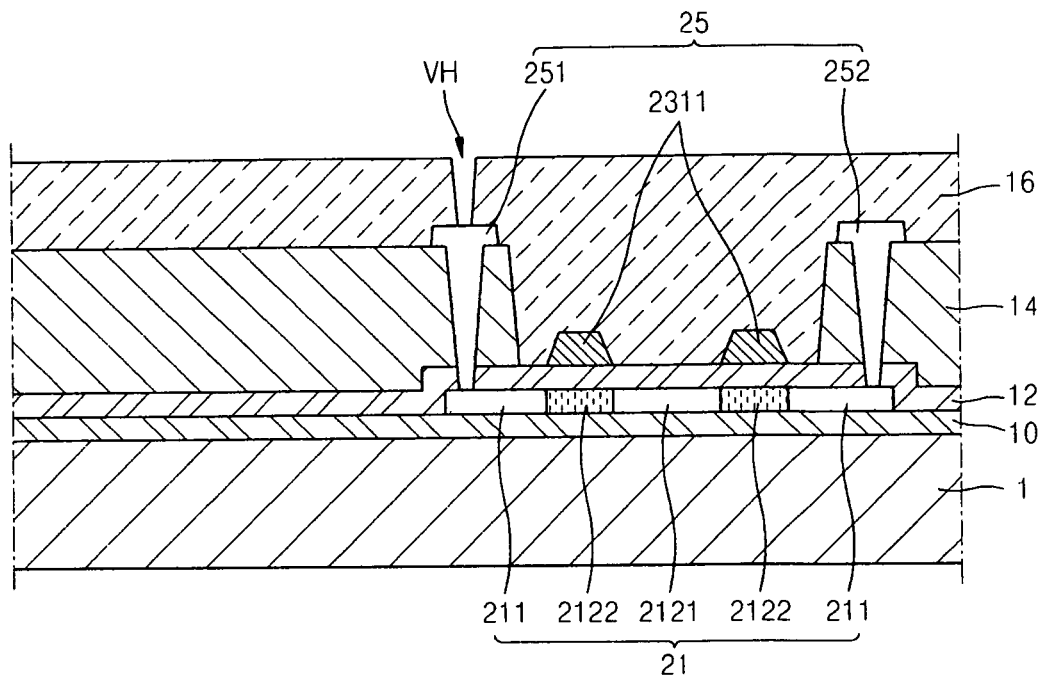

Next, as shown in FIG. 16, a third insulation layer 16 is formed on the substrate 1, and a via hole VH exposing any one of the source/drain electrodes 25 is formed by patterning the third insulation layer 16.

The third insulation layer 16 is formed so as to have a sufficient thickness (e.g., a thickness greater than that of the second insulation layer 14) to function as a planarizing layer for planarizing the top surface on which the pixel electrode (43 of FIG. 17) is to be formed or a passivation layer for protecting a TFT. Here, the third insulation layer 16 may be formed of one or more organic insulation material selected from a group consisting of polyimide, polyamide, acrylic resins, benzocyclobuten, and phenol resions by using a method, such as spin coating. Meanwhile, the third insulation layer 16 may not only be formed of an organic insulation material as described above, but may also be formed of an inorganic insulation material selected from among $SiO_2$, $SiN_x$, $Al_2O_3$, $CuO_x$, $Tb_4O_7$, $Y_2O_3$, $Nb_2O_5$, $Pr_2O_4$, etc. Furthermore, the third insulation layer 16 may be formed so as to have a multilayer structure in which an organic insulation material and an inorganic insulation material are alternately stacked.

In detail, the via hole VH may be formed by patterning the third insulation layer 16 in a masking operation using a fifth mask (not shown).

The via hole VH is formed to provide an electrical connection between the pixel electrode (43 of FIG. 17) and a TFT. Although FIG. 16 shows that the via hole VH is formed to expose the drain electrode 251, the present invention is not limited thereto. Furthermore, location and shape of the via hole VH is not limited to those shown in FIG. 16.

Figure 17:
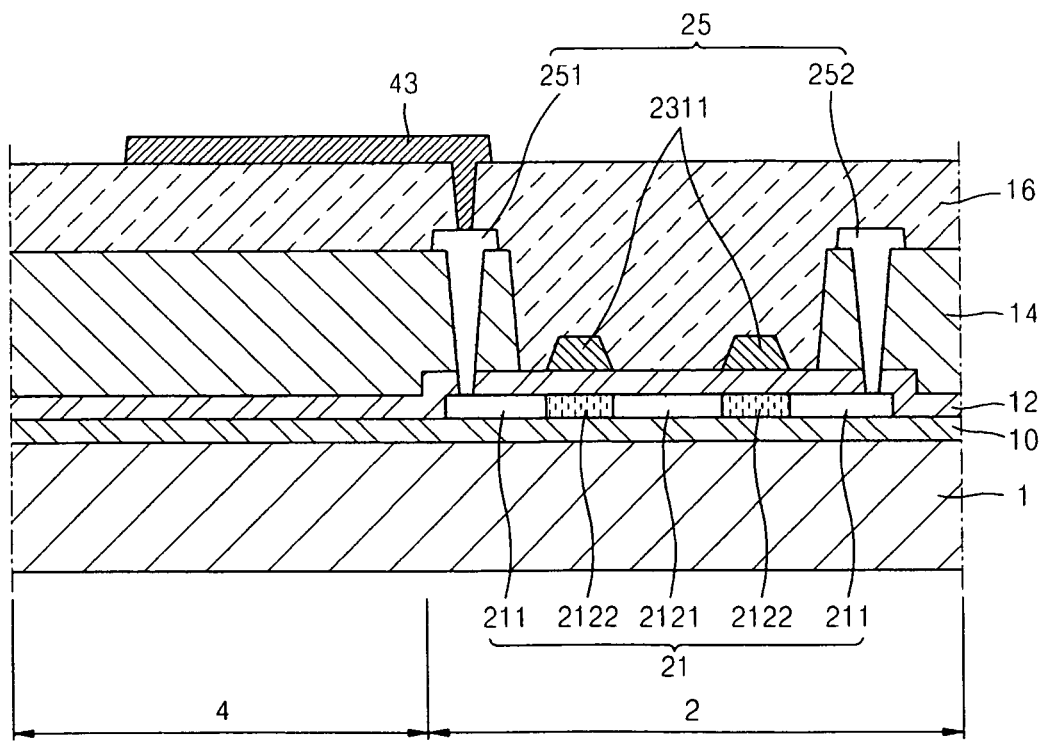

Next, referring to FIG. 17, the pixel electrode 43, which is electrically connected to the source electrode 252 or the drain electrode 251, is formed on the third insulation layer 16.

In detail, the pixel electrode 42 may be formed by patterning a transparent conductive layer in a masking operation using a sixth mask (not shown).

The pixel electrode 43 is formed in the light emitting region 4 and contacts the source electrode 252 or the drain electrode 251 via the via hole VH. The pixel electrode 43 may be formed of any of various materials according to light emission type of an organic light emitting display device. For example, in the case of a bottom-emission type in which an image is embodied in a direction toward the substrate 1 or a dual-emission type in which an image is embodied in both directions toward and away from the substrate 1, the pixel electrode 43 is formed of a transparent metal oxide. The pixel electrode 43 may include one or more materials selected from among ITO, IZO, ZnO, and $In_2O_3$. In this case, as shown in FIG. 17, the light emitting region 4 is designed so as not to overlap the transistor region 2. Meanwhile, in the case of a top-emission type in which an image is formed in a direction away from the substrate 1, the pixel electrode 43 may further include a reflective electrode that is formed of a light-reflecting material. In this case, although not shown, the light emitting region 4 may be formed so as to overlap the transistor region 2.

Figure 18:
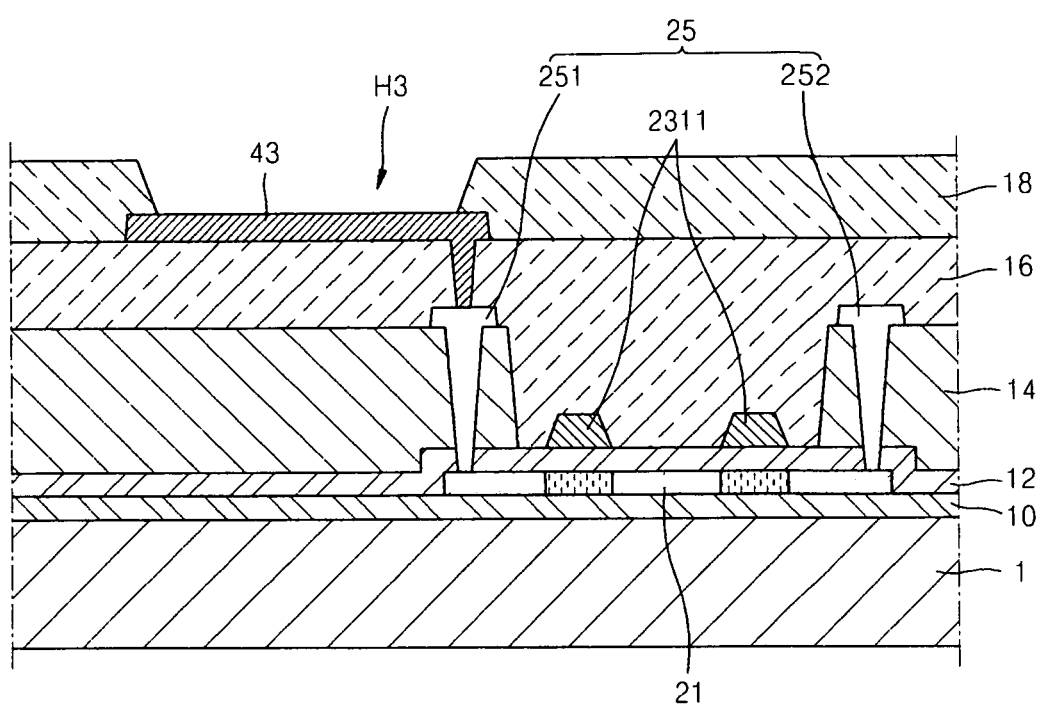

Next, as shown in FIG. 18, a fourth insulation layer 18 is formed on the pixel electrode 43, and a third opening H3 which exposes the pixel electrode 43 is formed by patterning the fourth insulation layer 18.

In detail, the third opening H3 may be formed by patterning the fourth insulation layer 18 in a masking operation using a seventh mask (not shown).

The fourth insulation layer 18 is formed of one or more organic insulation material selected from a group consisting of polyimide, polyamide, acrylic resins, benzocyclobuten, and phenol resions by using a method, such as spin coating. Alternatively, the fourth insulation layer 18 may be formed by alternately stacking an organic insulation material and an inorganic insulation material. A pixel is defined by forming the third opening H3 in the fourth insulation layer 18 so as to expose the center of the pixel electrode 43.

Finally, the intermediate layer (45 of FIG. 6), which includes an emissive layer, and the counter electrode (47 of FIG. 6) are formed in the third opening H3 exposing the pixel electrode 43.

The intermediate layer 45 may be formed by stacking a hole injection layer (HIL), a hole transport layer (HTL), an electron transport layer (ETL), and an electron injection layer (EIL) in a single or multi-layer structure.

The intermediate layer 45 may be formed of an organic monomer material or a high molecular material.

In the case where the intermediate layer 45 is formed of an organic monomer material, the intermediate layer 45 may be formed by stacking a HTL and a HIL from the organic emissive layer toward the pixel electrode 43, and stacking an ETL and an EIL from the organic emissive layer toward the counter electrode 47. Furthermore, various other layers may be stacked as an occasion demands. Here, various organic raw materials, which include copper phthalocyanine (CuPc), N,N-di(naphthalene-1-yl)-N,N'-diphenyl-benzidine (NPB), and tris-8-hydroxyquinoline aluminum (Alq3), may be used.

Meanwhile, in the case where the intermediate layer 45 is formed of an organic polymer material, the intermediate layer 45 may only contain a HTL from the organic emissive layer toward the pixel electrode 43. The HTL may be formed of poly(3,4-ethylenedioxythiophene) (PEDOT) or polyaniline (PANI) via inkjet printing or spin coating. Here, the organic polymer material may include a poly-phenylenevinylene (PPV)-based material and a polyfluorene-based material, and the EML may be formed by using a general method, such as inkjet printing, spin coating, or heat transfer using laser.

The counter electrode 47 may be deposited on the top surface of the substrate 1 and may function as a common electrode. In the case of an organic light emitting display device according to the present embodiment, the pixel electrode 43 is used as an anode, whereas the counter electrode 47 is used as a cathode, or vice versa.

In the case where an organic light emitting display device is a bottom-emission type in which images are formed in a direction toward the substrate 1, the pixel electrode 43 becomes a transparent electrode, whereas the counter electrode 47 becomes a reflective electrode. Here, the reflective electrode may be formed by thinly depositing a metal with relatively small work function, e.g., Ag, Mg, Al, Pt, Pd, Au, Ni, Nd, Ir, Cr, Li, Ca, LiF, or a compound thereof.

In FIGS. 7 through 18, a back plane is fabricated by using about 7 or 8 masks. However, such a process for fabricating a back plane for a flat panel display device requires a plurality of masking operations, and thus fabrication cost increases.

Figure 19:
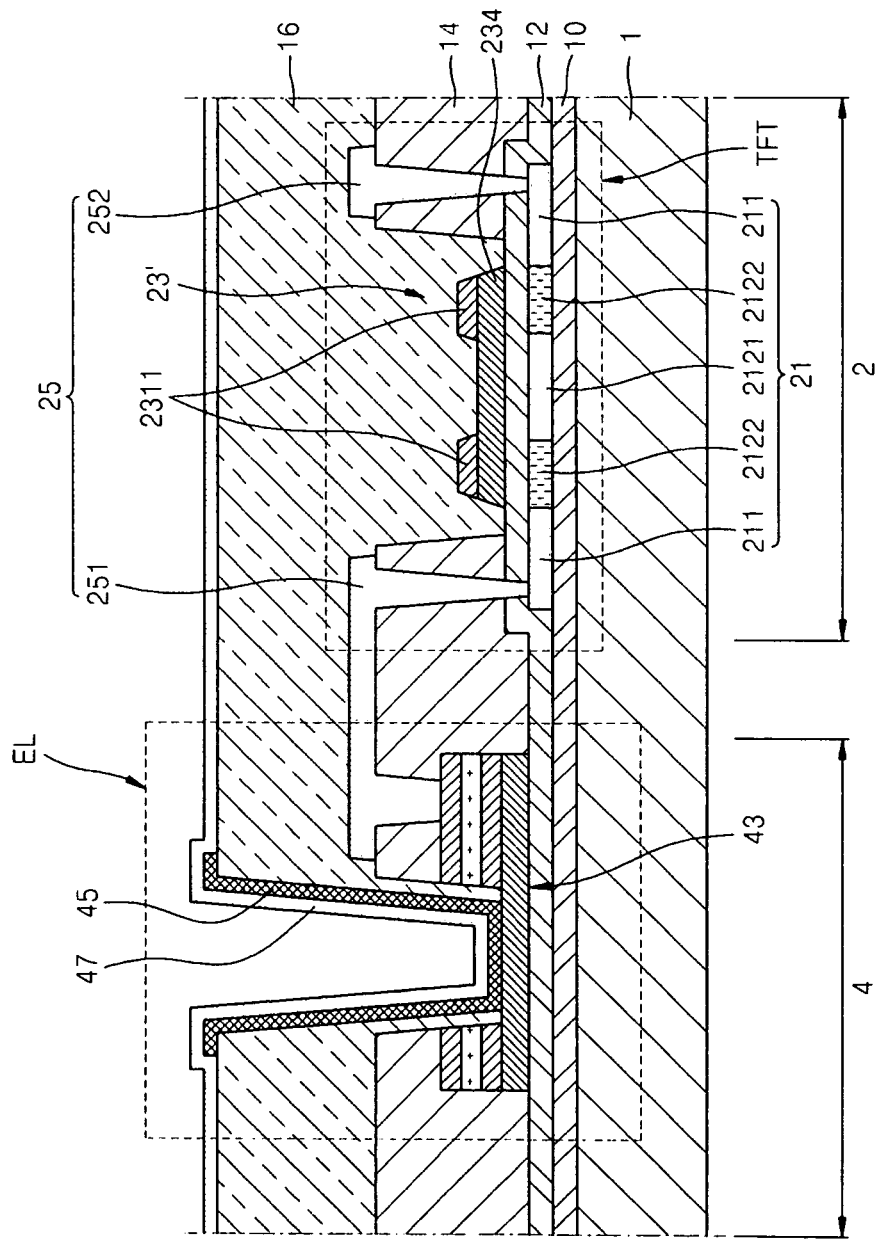
FIG. 19 is a schematic sectional view of a flat panel display device according to another embodiment of the present invention.

FIG. 19 is a schematic sectional view of a flat panel display device according to another embodiment of the present invention.

Referring to FIG. 19, the flat panel display device at least includes the transistor region 2 and the light emitting region 4.

The transistor region 2 includes a TFT as a driving device. The TFT includes the active layer 21, a gate electrode 23', and the source/drain electrodes 25. The gate electrode 23' includes a lower conductive layer and an upper conductive layer. The lower conductive layer (referred to hereinafter as a fourth conductive layer 234) may be formed of a transparent conductive material, whereas the upper conductive layer (referred to hereinafter as the fine gate electrodes 2311) may be formed of a conductive material with relatively low electrical resistance. Meanwhile, as described above with reference to FIG. 6, the gate electrode 23 includes at least one fine gate electrode 2311, and the fine gate electrodes 2311 are formed of a conductive material with relatively low electrical resistance. The first insulation layer 12 is interposed between the gate electrode 23 and the active layer 21 as a gate insulation layer. Furthermore, the source/drain regions 211 and 2121 doped with impurities are respectively formed at two opposite ends of the active layer 21 and the center portion of the active layer 21 not corresponding to the fine gate electrode 2311. Particularly, the source/drain regions 211 formed at two opposite ends of the active layer 21 are connected to the source/drain electrodes 252 and 251, respectively. Meanwhile, a channel region 2122 is formed in a portion of the active layer 21 corresponding to the fine gate electrode 2311.

The light emitting region 4 includes an organic light emitting device EL. The organic light emitting device EL includes the pixel electrode 43 that is connected to the source electrode 252 or the drain electrode 251 of the TFT, the counter electrode 47 that is formed to face the pixel electrode 43, and the intermediate layer 45 which is interposed therebetween. The pixel electrode 43 is formed of a transparent conductive material and may be formed of the same material and on the same layer as the fourth conductive layer 234 of the TFT.

Unlike in FIG. 6, FIG. 19 shows that the fourth conductive layer 234 containing a transparent conductive material is arranged below the fine gate electrodes 2311, and thus the gate electrode and the pixel electrode are simultaneously formed. By employing such a coplanar structure, a back plane for a flat panel display device may be fabricated with less masking operations as compared to the embodiments shown in FIG. 6.

FIGS. 20 through 29 are schematic sectional views showing operations for manufacturing the flat panel display device shown in FIG. 19.

Figure 20:
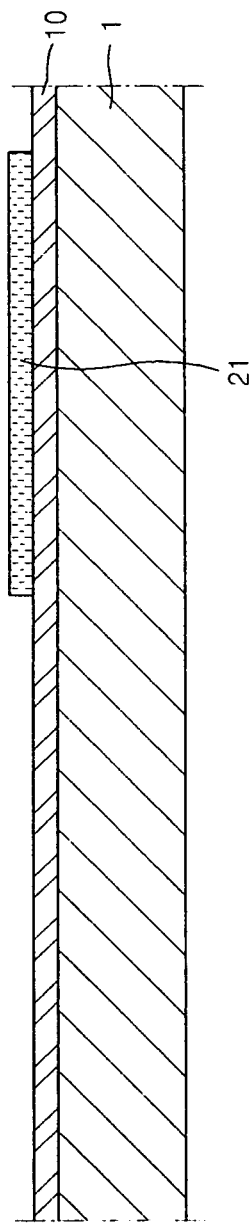
FIGS. 20 through 29 are schematic sectional views showing operations for manufacturing the flat panel display device shown in FIG. 19.

First, as shown in FIG. 20, the active layer 21 of the TFT is formed on the substrate on which the auxiliary layer 10 is formed. The active layer 21 is patterned in a masking operation using the first mask (not shown).

Figure 21:
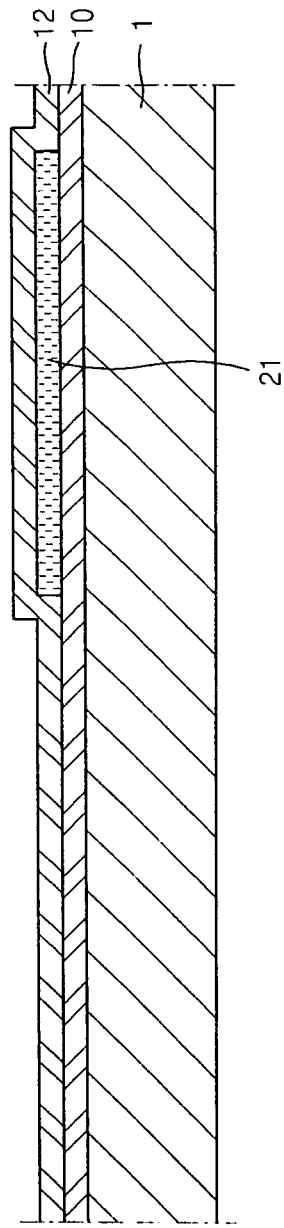

Next, as shown in FIG. 21, the first insulation layer 12 is formed on the auxiliary layer 10 so as to cover the active layer 21.

Figure 22:
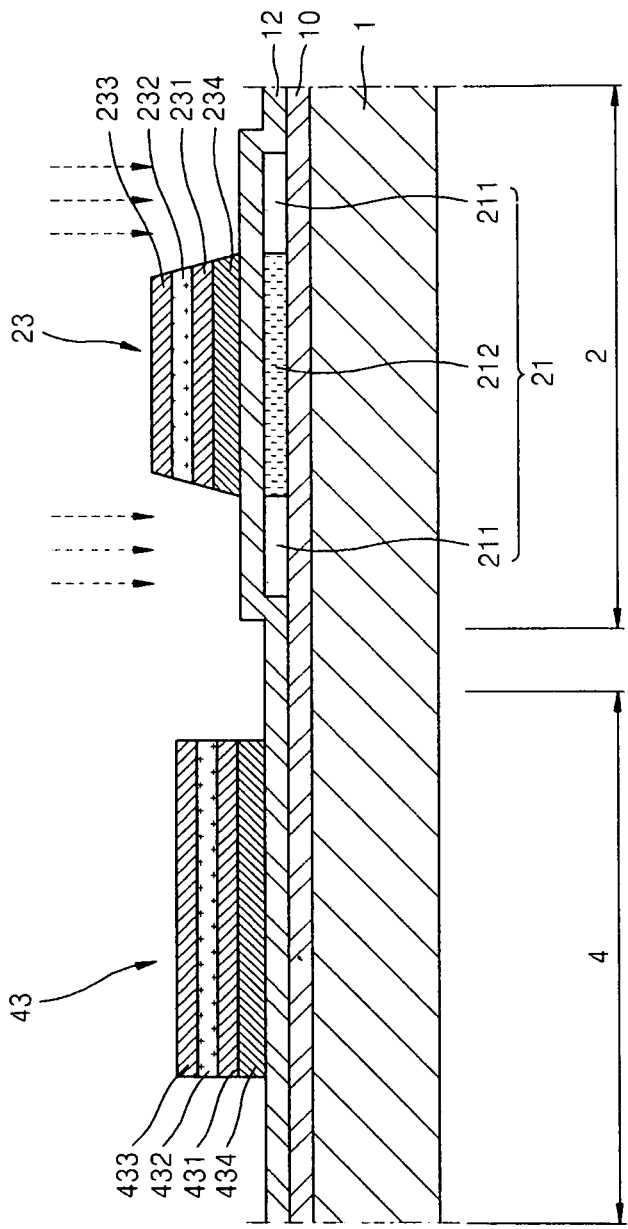

Next, as shown in FIG. 22, the gate electrode 23 and the pixel electrode 43 are formed.

The pixel electrode 43 and the gate electrode 23 are patterned in an operation using a fourth layer (not shown), a first layer (not shown), a second layer (not shown), and a third layer (not shown) that are stacked on the substrate 1 in the order stated as a second mask (not shown).

In detail, the gate electrode 23 includes the fourth conductive layer 234 corresponding at least to the fourth layer, the first conductive layer 231 corresponding to the first layer, the second conductive layer 232 corresponding to the second layer, and the third conductive layer 233 corresponding to the third layer, that are stacked in the order stated on the substrate 1. Here, the second conductive layer 232 features higher etch selectivity as compared to the first conductive layer 231 and the third conductive layer 233. In other words, the second conductive layer 232 is etched more than the first conductive layer 231 and the third conductive layer 233 under the same etching condition. Meanwhile, the pixel electrode 43 includes a fourth electrode layer 434 corresponding at least to the fourth layer, a first electrode layer 431 corresponding to the first layer, a second electrode layer 432 corresponding to the second layer, and a third electrode layer 433 corresponding to the third layer, that are stacked in the order stated on the substrate 1. Here, the second electrode layer 432 and the second conductive layer 232 may contain aluminum (Al), whereas the first electrode layer 431, the third electrode layer 433, the first conductive layer 231, and the third conductive layer 233 may contain one or more selected from a group consisting of silver (Ag), platinum (Pt), lead (Pd), gold (Au), nickel (Ni), neodymium (Nd), iridium (Ir), chrome (Cr), molybdenum (Mo), titanium (Ti), tungsten (W), copper (Cu), and alloys thereof. Furthermore, the fourth electrode layer 434 and the fourth conductive layer 234 may contain one or more transparent materials selected from among ITO, IZO, ZnO, and $In_2O_3$.

Here, the gate electrode 23 is formed so as to correspond to the center of the active layer 21, and the source/drain regions 211 are formed at the two opposite ends of the active layer 21 while the channel layer 212 is formed between the source/drain regions 211, by implanting an n-type impurity or a p-type impurity into the active layer 21 by using the gate electrode 23 as a self-align mask.

Figure 23:
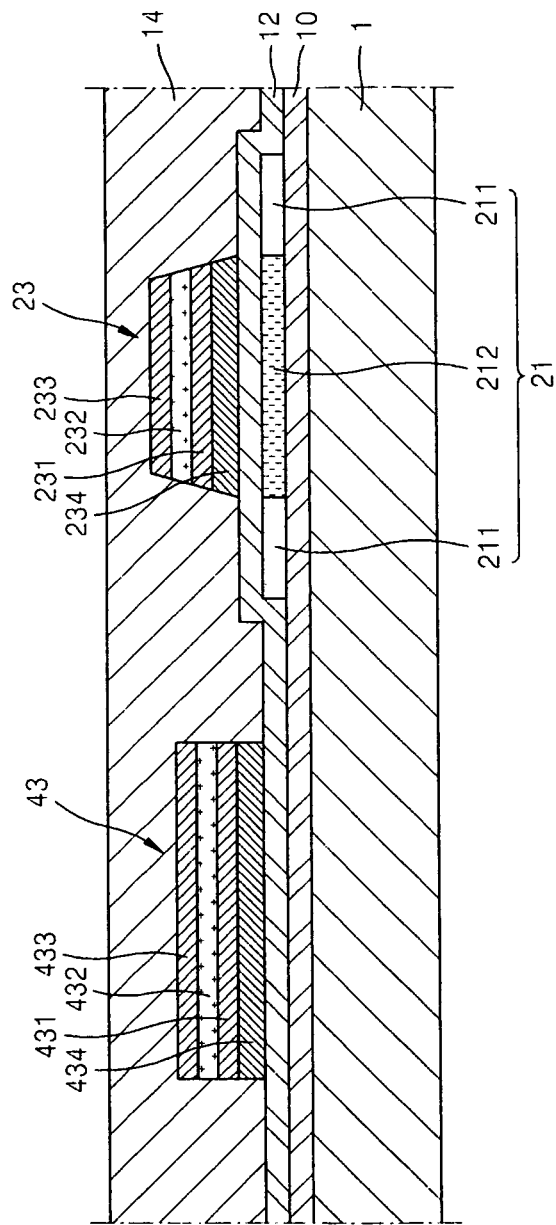

Next, as shown in FIG. 23, the second insulation layer 14 is formed on the first insulation layer 12 so as to cover the gate electrode 23 and the pixel electrode 43.

Figure 28:
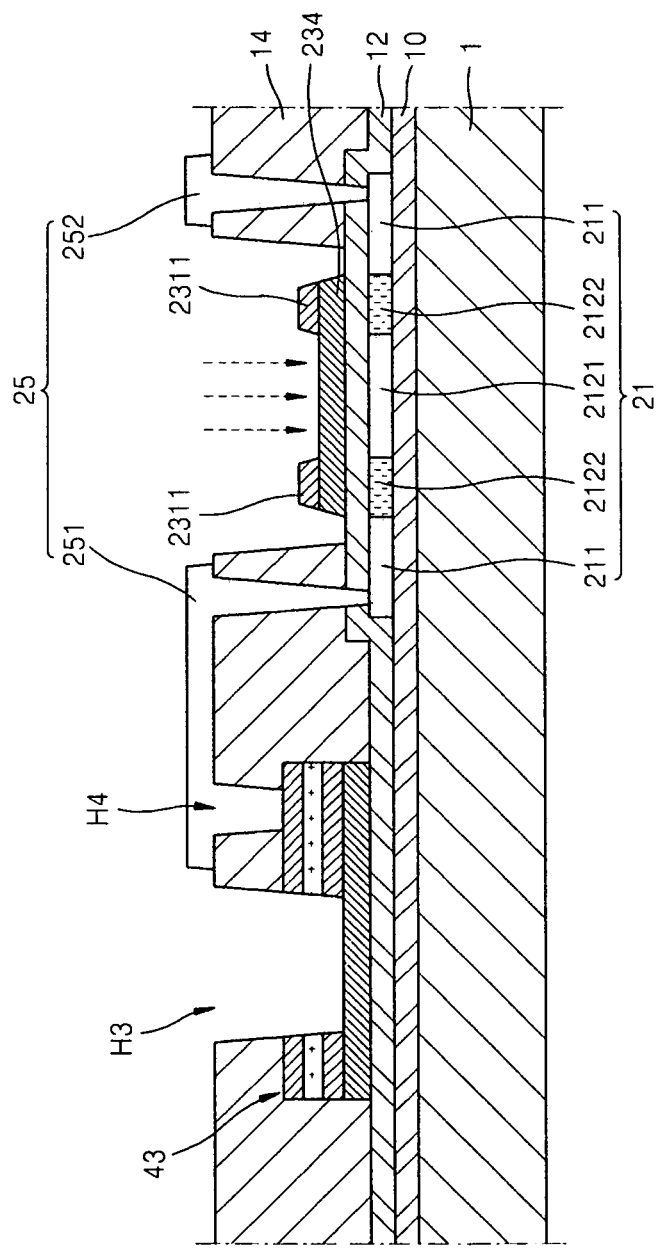

The second insulation layer 14 functions as an interlayer insulation layer between the gate electrode 23 of the TFT and the source/drain electrodes 25 of FIG. 28. Meanwhile, the second insulation layer 14 may not only be formed of an organic insulation material as described above, but may also be formed of an inorganic insulation material like the first insulation layer 12 described above. Alternatively, the second insulation layer 14 may be formed by alternately stacking an organic insulation material and an inorganic insulation material.

Figure 24A:
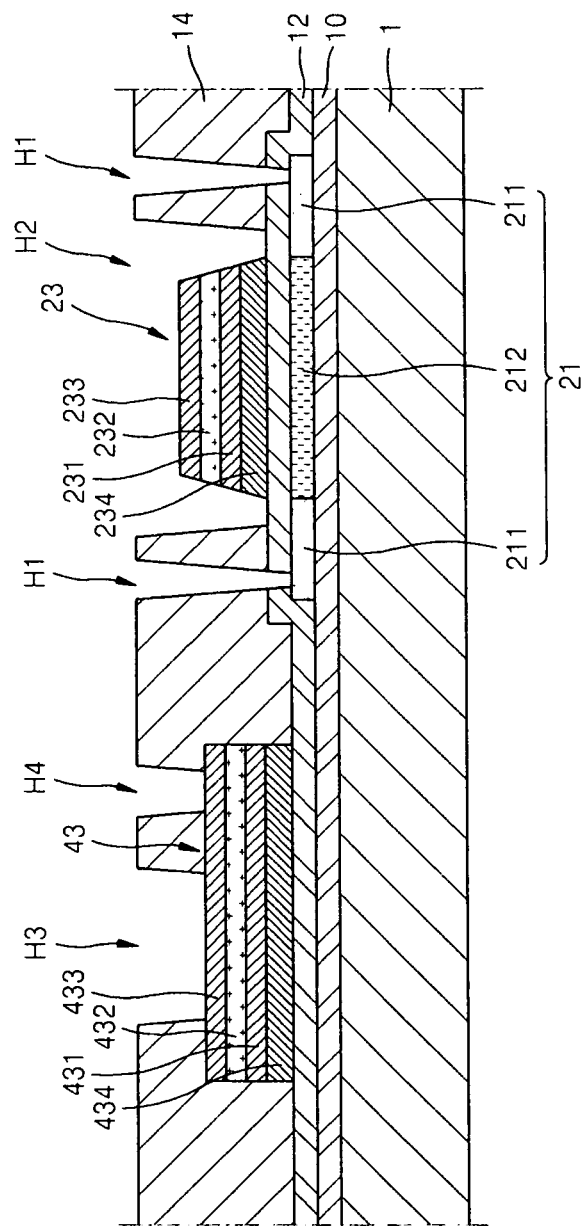

Next, referring to FIG. 24A, openings H1, H2, H3, and H4 which respectively expose the pixel electrode 43, portions of the source/drain region 211, and the entire gate electrode 23 are formed in the second insulation layer 14 and/or the first insulation layer 12.

The openings H1, H2, H3, and H4 are patterned in a masking operation using at least a third mask (not shown).

The first opening H1 is formed in the first insulation layer 12 and the second insulation layer 14 to expose a portion of the source/drain region 211, and the second opening H2 is formed in the second insulation layer 14 to expose the entire gate electrode 23. Particularly, the second opening H2 is formed in such a manner that a gap is formed between the inner surface of the second opening H2 and the outer surface of the gate electrode 23. Meanwhile, the third opening H3 and the fourth opening H4 expose portions of the third electrode layer 433 constituting the upper portion of the pixel electrode 43.

In FIG. 24A, as described above with reference to FIG. 11A, the second opening H2 is only formed in the second insulation layer 14 and does not expose the active layer 21. Therefore, in FIG. 24A, the first insulation layer 12 and the second insulation layer 14 may be separately patterned either in two masking operations or by using a half-tone mask (not shown).

In FIG. 24B, as described above with reference to FIG. 11B, both the first openings H1 and the second opening H2 are formed in both the first insulation layer 12 and the second insulation layer 14 and expose respective portions of the active layer 21. Therefore, in FIG. 24B, the first opening H1 and the second opening H2 may be formed in a single masking operation using a third mask (not shown) for simultaneously patterning the first insulation layer 12 and the second insulation layer 14.

Figure 25:
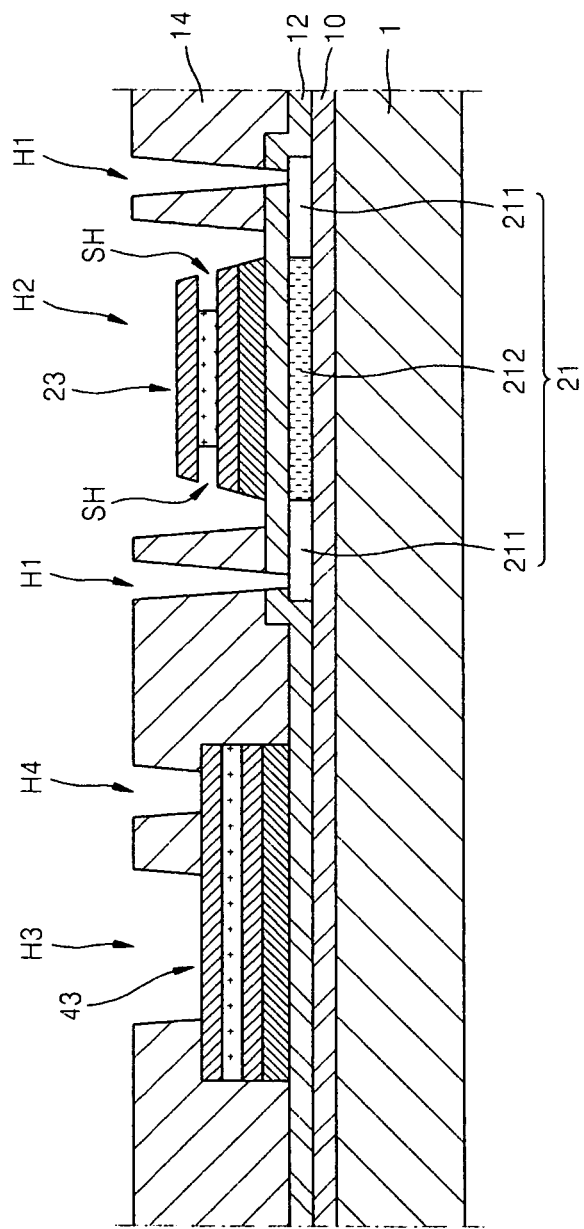

Next, as shown in FIG. 25, the side holes SH are formed by selectively removing portions of the second conductive layer 232 at ends of the gate electrode 23.

In detail, the side holes SH may be formed via chemical etching or physical etching. For example, the side holes SH may be formed by supplying an etchant consisting of fluoric acid (HF), hydrochloric acid (HCl), sulfuric acid ($H_2SO_4$), nitric acid, phosphoric acid, acetic acid, or a compound thereof to the gate electrode 23, and selectively removing the second conductive layer 232 having relatively high etch selectivity. Here, the side holes SH may be formed in ends or outer portions of the gate electrode 23 that may likely be contacted by an etchant, and the depth of the side holes SH from the outer portion of the gate electrode 23 may be from about 1 μm to about 2 μm. Depth and width of the side holes SH may be controlled by changing the type of etchant and etching time.

Figure 26:
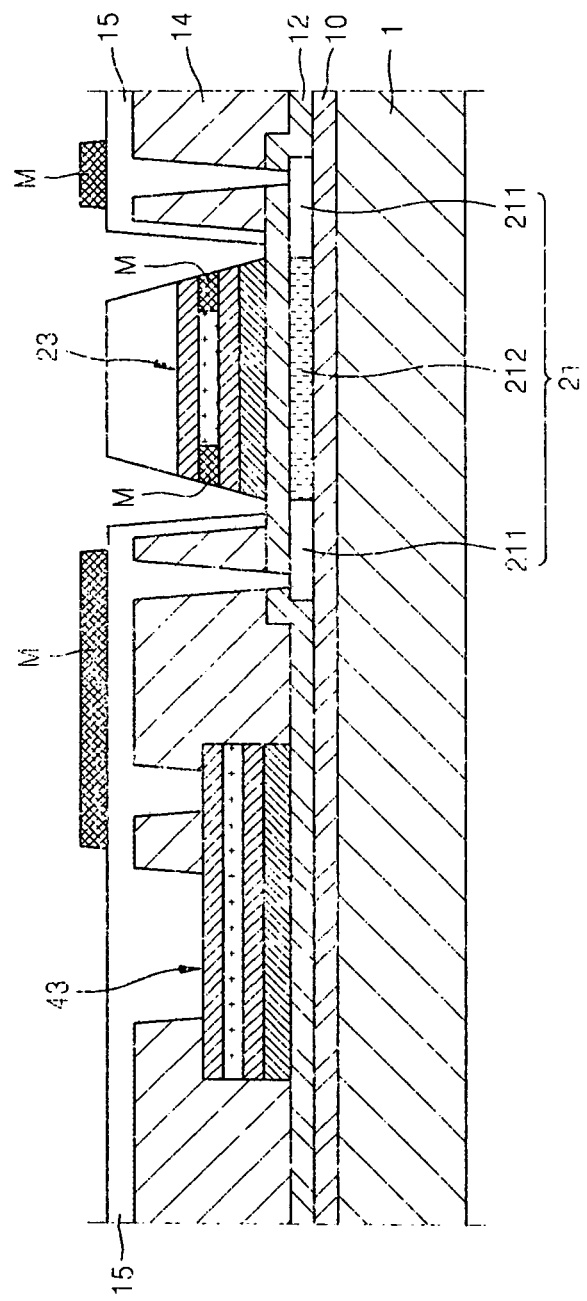

Next, as shown in FIG. 26, the metal layer 15 for forming the source/drain electrodes (25 of FIG. 19) is formed on the substrate 1 so as to cover the gate electrode 23 and the second insulation layer 14, and the masking material M is applied thereto.

The metal layer 15 may be formed of a conductive material having relatively low electric resistance the same as materials constituting the first conductive layer 231 and the third conductive layer 233. However, the present invention is not limited thereto, and the metal layer 15 may be formed of any of various conductive materials. Meanwhile, the metal layer 15 is formed so as to have a sufficient thickness to fill the first openings H1, but the metal layer 15 is formed so as not to fill the second opening H2. Here, the second opening H2 is formed to completely expose the gate electrode 23, and particularly, a gap is formed between the outer surface of the gate electrode 23 and the inner surface of the second opening H2. The gap provides bad step coverage to prevent the second opening H2 from being completely filled with the metal layer 15.

The masking material M is uniformly and thoroughly applied onto the metal layer 15. Particularly, the masking material M is injected into the side holes SH.

After the masking material M is applied, a masking layer is left at a location, at which at least the source/drain electrodes 25 are to be formed, in a masking operation using a fourth mask (not shown). Here, the masking material M is still injected into the side holes SH.

Figure 27:
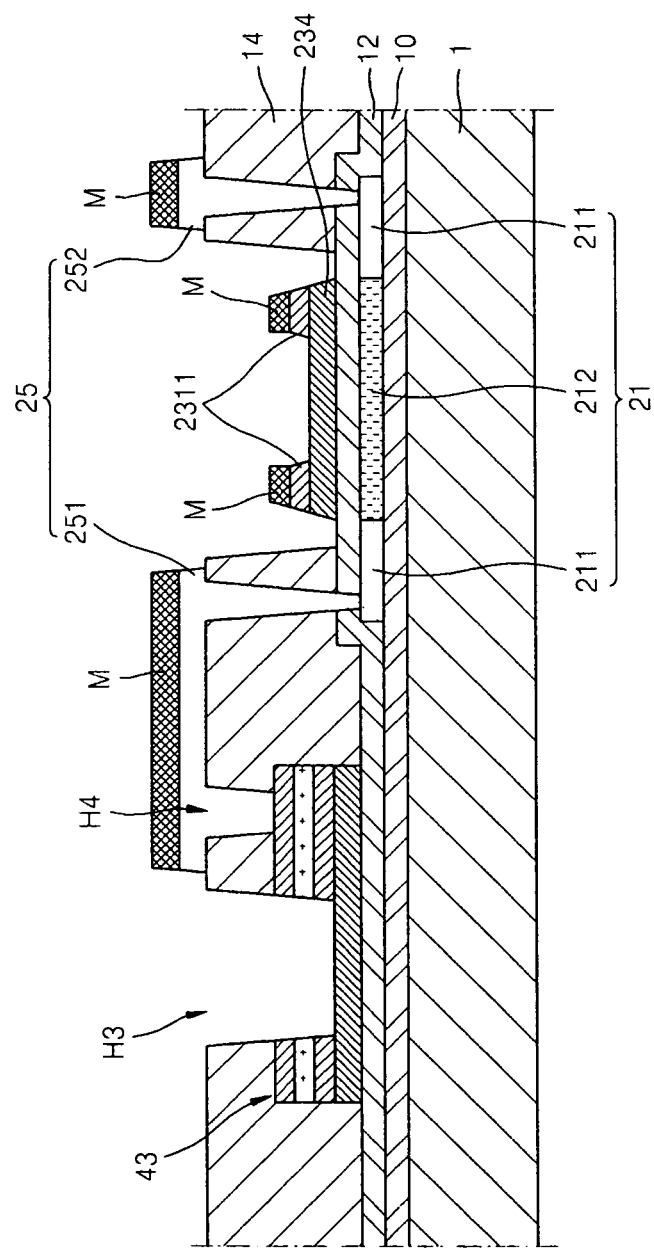

Next, as shown in FIG. 27, the source/drain electrodes 25 are formed by etching the metal layer (15 of FIG. 26) by using the remaining masking layer M as a mask, and the fine gate electrodes 2311 are formed by etching the gate electrode (23 of FIG. 26) by using the masking material M injected into the side holes SH as a mask.

In detail, the fine gate electrodes 2311 are formed by leaving a portion of the first conductive layer 231 (FIG. 24B) located below the masking material M by patterning the gate electrode 23 (FIG. 26) by using the masking material M injected into the side holes SH as a mask. In other words, the entire third conductive layer 233 (FIG. 24B) constituting the gate electrode 23, the entire second conductive layer 232 in which the side holes SH are formed, and the first conductive layer 231 except a portion corresponding to the masking material M are removed. Therefore, the remaining portion of the first conductive layer 231 becomes fine gate electrodes 2311 of FIG. 27. Here, the width of the fine gate electrodes 2311 may correspond to the depth of the side hole SH of FIG. 25. Meanwhile, the fourth conductive layer 234 may remain as shown in FIG. 27, or may be removed.

Furthermore, either of the source/drain electrodes 25 is formed so as to be electrically coupled with the pixel electrode 43 via the fourth opening H4 in the end portion of the third electrode layer 433 (FIG. 24B) arranged on the pixel electrode 43.

In addition, the first through third electrode layers 431, 432, and 433 (FIG. 24B) of the pixel electrode 43 that are exposed by the opening H3 are removed when the source/drain electrodes 25 are formed or by an additional etching process, and the fourth electrode layer 434 of the pixel electrode 43 is exposed by the third opening H3.

Next, as shown in FIG. 28, the active layer 21 is re-doped with an n-type impurity or a p-type impurity.

In detail, an n-type impurity or a p-type impurity may be implanted to the center of the active layer 21, which is used so as to be covered by the gate electrode 23, via the second opening H2. Here, the source/drain regions 2121 may be formed at the center of the active layer 21 by using the fine gate electrode 2311 as a self-align mask, and the two channel regions 2122 connected in series may be formed.

Figure 29:
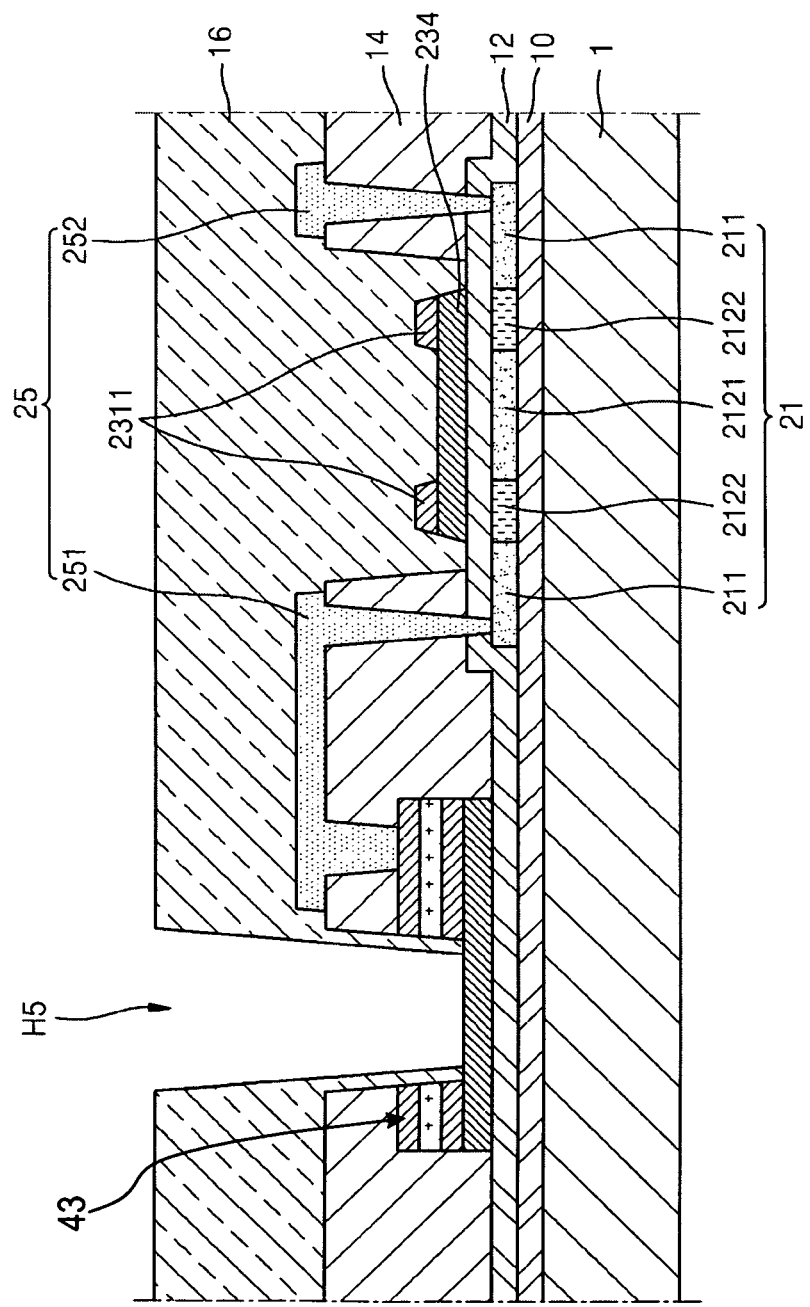

Next, as shown in FIG. 29, the third insulation layer 16 is formed so as to cover the TFT and the pixel electrode 43, and a pixel defining layer (PDL) is formed by patterning a fifth opening H5 which exposes the pixel electrode 43.

Here, the third insulation layer 16 may be formed of one or more organic insulation materials selected from a group consisting of polyimide, polyamide, acrylic resins, benzocyclobuten, and phenol resions by using a method, such as spin coating. Meanwhile, the third insulation layer 16 may not only be formed of an organic insulation material as described above, but may also be formed of an inorganic insulation material, such as $SiO_2$, $SiN_x$, $Al_2O_3$, $CuO_x$, $Tb_4O_7$, $Y_2O_3$, $Nb_2O_5$, $Pr_2O_3$, etc. Alternatively, the third insulation layer 16 may be formed by alternately stacking an organic insulation material and an inorganic insulation material.

The PDL defines pixels by forming the fifth opening H5 by patterning the third insulation layer 16 so as to expose the center of the pixel electrode 43 in a masking operation using a fifth mask (not shown).

Finally, the intermediate layer (45 of FIG. 19), which includes an emissive layer, and the counter electrode (47 of FIG. 19) are formed in the fifth opening H5 exposing the pixel electrode 43.

In each of the masking operations for forming an organic light emitting display device as described above, stacked layers may be removed by performing dry-etching or wet-etching.

Furthermore, although only one TFT is shown in the FIGS. 6 and 19 for convenience of explanation, the present invention is not limited thereto, and a plurality of TFTs may be provided without increasing the number of masking operations.

According to the present embodiment, fine wires having a width below or equal to from about 1 μm to about 2 μm and fine gate electrodes may be manufactured by using conventional equipment. Therefore, the present embodiment provides cost-wise competence and may be applied to mass-production.

Furthermore, dead space may be reduced due to reduction of an internal circuit of a flat panel display device due to fine wires and fine gate electrodes that are manufactured by using a method according to the present invention, and opening rate may be increased due to reduction of the volume of wires and a TFT in a pixel While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A method of manufacturing a wire, the method comprising the steps of:
    forming a wire pattern, which at least includes a first conductive layer, a second conductive layer and a third conductive layer disposed in the order stated on a substrate, wherein at least the second conductive layer has higher etch selectivity than the first and third conductive layers;
    forming side holes by removing portions of the second conductive layer at ends of the wire pattern;
    forming fine wires by injecting a masking material into the side holes: and
    patterning the wire pattern by using the masking material as a mask.

2. The method of claim 1, wherein the second conductive layer of the wire pattern contains aluminum.

3. The method of claim 1, wherein the first and third conductive layers of the wire pattern contain at least one material selected from a group consisting of silver (Ag), platinum (Pt), lead (Pd), gold (Au), nickel (Ni), neodymium (Nd), iridium (Ir), chrome (Cr), molybdenum (Mo), titanium (Ti), tungsten (W), copper (Cu), and alloys thereof.

4. The method of claim 1, wherein the wire pattern is arranged below the first conductive layer and further comprises a fourth conductive layer containing a metal oxide.

5. The method of claim 1, wherein the step of patterning the wire pattern comprises removing an entirety of the third conductive layer including the wire pattern, removing an entirety of the second conductive layer in which the side holes are formed, and removing the first conductive layer except a portion corresponding to the masking material.

6. The method of claim 1, wherein the wire pattern comprises the first conductive layer.

7. The method of claim 1, wherein the step of forming the side holes comprises a step of selectively removing the second conductive layer by using an acidic etchant.

8. A method of manufacturing a thin-film transistor (TFT), the method comprising the steps of:
    executing a first masking operation for forming an active layer on a substrate;
    forming a first insulation layer on the substrate to cover the active layer;
    executing a second masking operation on the first insulation layer for forming a gate electrode, which at least includes a first conductive layer, a second conductive layer, and a third conductive layer arranged in the order stated on a substrate, wherein at least the second conductive layer has higher etch selectivity than the first and third conductive layers;
    forming a second insulation layer on the first insulation layer so as to cover the gate electrode;
    executing a third masking operation for forming first openings exposing two opposite ends of the active layer by patterning the first insulation layer and the second insulation layer, and for forming a second opening exposing an entirety of the gate electrode by patterning at least the second insulation layer;
    forming side holes by removing portions of the second conductive layer at ends of the exposed gate electrode; and
    executing a fourth masking operation for forming source/drain electrodes and fine gate electrodes by forming a metal layer at least on the second insulation layer, for forming a masking layer to correspond at least to the first openings, for injecting a masking material into the side holes, and for patterning the metal layer and the gate electrode by using the masking layer and the masking material as masks.

9. The method of claim 8, wherein the second conductive layer of the gate electrode contains aluminum.

10. The method of claim 8, wherein the first and third conductive layers of the gate electrode contain at least one material selected from a group consisting of silver (Ag), platinum (Pt), lead (Pd), gold (Au), nickel (Ni), neodymium (Nd), iridium (Ir), chrome (Cr), molybdenum (Mo), titanium (Ti), tungsten (W), copper (Cu), and alloys thereof.

11. The method of claim 8, wherein the gate electrode is arranged below the first conductive layer and further comprises a fourth conductive layer containing a metal oxide.

12. The method of claim 8, wherein the third masking operation comprises:

a third-first masking operation for patterning the second insulation layer in correspondence to the first openings and the second opening; and a third-second masking operation for patterning the first insulation layer in correspondence to the first openings.

13. The method of claim 8, wherein, in the third masking operation, the first insulation layer and the second insulation layer corresponding to the first openings and the second insulation layer corresponding to the second opening are patterned by using a half-tone mask.

14. The method of claim 8, wherein, in the third masking operation, the first insulation layer and the second insulation layer corresponding to the first openings and the second opening are simultaneously patterned.

15. The method of claim 8, wherein, in the fourth masking operation, the gate electrode is patterned at the same time that the metal layer is patterned, and wherein the fine gate electrodes are formed by removing an entirety of the third conductive layer including the gate electrode, an entirety of the second conductive layer in which the side holes are formed, and the first conductive layer except a portion corresponding to the masking material.

16. The method of claim 8, wherein fine wire patterns comprise the first conductive layer.

17. The method of claim 8, further comprising forming at least one third insulation layer which includes at least one of an organic material and an inorganic material to cover the source/drain electrodes after the fourth masking operation.

18. The method of claim 8, wherein the active layer contains one of amorphous silicon and crystalline silicon.

19. The method of claim 8, wherein, after the second masking operation, the active layer except a portion corresponding to the gate electrode is doped with an impurity.

20. The method of claim 8, wherein, after the fourth masking operation, the active layer except a portion corresponding to the fine gate electrodes is doped with an impurity.

21. The method of claim 8, wherein the step of forming the side holes comprises selectively removing the second conductive layer by using an acidic etchant.

22. The method of claim 8, wherein the second opening is formed in the third masking operation in such a manner that a gap is formed between an outer surface of the gate electrode and an inner surface of the second opening.

23. The method of claim 22, wherein the metal layer is formed so as not to completely fill the gap between the outer surface of the gate electrode and the inner surface of the second opening.

24. A method of manufacturing a flat panel display device, the method comprising the steps of:

executing a first masking operation for forming an active layer on a substrate;

forming a first insulation layer on the substrate so as to cover the active layer;

executing a second masking operation on the first insulation layer for forming a gate electrode, which at least includes a first conductive layer, a second conductive layer, and a third conductive layer arranged in the order stated on a substrate, wherein at least the second conductive layer has higher etch selectivity than the first and third conductive layers;

forming a second insulation layer on the first insulation layer so as to cover the gate electrode;

executing a third masking operation for forming first openings exposing two opposite ends of the active layer by patterning the first insulation layer and the second insulation layer, and for forming a second opening exposing an entirety of the gate electrode by patterning at least the second insulation layer;

forming side holes by removing portions of the second conductive layer at ends of the exposed gate electrode;

executing a fourth masking operation for forming source/drain electrodes and fine gate electrodes by forming a metal layer at least on the second insulation layer, for forming a masking layer to correspond at least to the first openings, for injecting a masking material into the side holes, and for patterning the metal layer and the gate electrode by using the masking layer and the masking material as masks;

forming a third insulation layer so as to cover the source/drain electrodes and the fine gate electrodes; and forming an organic light emitting device electrically connected to one of the source/drain electrodes.

25. The method of claim 24, wherein the second conductive layer of the gate electrode contains aluminum.

26. The method of claim 24, wherein the first and third conductive layers of the gate electrode contain at least one material selected from a group consisting of silver (Ag), platinum (Pt), lead (Pd), gold (Au), nickel (Ni), neodymium (Nd), iridium (Ir), chrome (Cr), molybdenum (Mo), titanium (Ti), tungsten (W), copper (Cu), and alloys thereof.

27. The method of claim 24, wherein the step of forming the organic light emitting device comprises:

executing a fifth masking operation for forming a third opening which penetrates through the third insulation layer and exposes one of the source/drain electrodes;

executing a sixth masking operation on the third insulation layer for forming a pixel electrode which is electrically connected to one of the source/drain electrodes via the third opening;

forming an intermediate layer, including an emissive layer, on the pixel electrode; and forming a counter electrode which faces the pixel electrode across the intermediate layer.

28. The method of claim 27, further comprising executing a seventh masking operation for forming a fourth insulation layer on the third insulation layer so as to cover ends of the pixel electrode.

29. The method of claim 27, wherein the gate electrode is arranged below the first conductive layer and further includes a fourth conductive layer containing a metal oxide.

30. The method of claim 29, wherein the second masking operation further comprises forming, on the first insulation layer, a pixel electrode which includes first through fourth electrode layers respectively corresponding to the first through fourth conductive layers;

wherein the third masking operation further comprises exposing at least a portion of the pixel electrode by removing the second insulation layer; and wherein the fourth masking operation further comprises removing the first through third electrode layers of the exposed pixel electrode.

31. The method of claim 30, wherein the step of forming the organic light emitting device further comprises:

a fifth masking operation for exposing the fourth electrode layer of the pixel electrode by removing the third insulation layer;

forming the intermediate layer, including the emissive layer, on the fourth electrode layer of the pixel electrode; and forming the counter electrode which faces the pixel electrode across the intermediate layer.

32. The method of claim 24, wherein the third masking operation comprises:
    executing a third-first masking operation for patterning the second insulation layer in correspondence to the first openings and the second opening; and
    executing a third-second masking operation for patterning the first insulation layer in correspondence to the first openings.

33. The method of claim 24, wherein, in the third masking operation, the first insulation layer and the second insulation layer corresponding to the first openings and the second insulation layer corresponding to the second opening are patterned by using a half-tone mask.

34. The method of claim 24, wherein, in the third masking operation, the first insulation layer and the second insulation layer corresponding to the first openings and the second opening are simultaneously patterned.

35. The method of claim 24, wherein, in the fourth masking operation, the gate electrode is patterned at the same time that the metal layer is patterned: and
    wherein the fine gate electrodes are formed by removing an entirety of the third conductive layer including the gate electrode, an entirety of the second conductive layer in which the side holes are formed, and the first conductive layer except a portion corresponding to the masking material.

\* \* \* \* \*